United States Patent
Tatemichi et al.

(10) Patent No.: US 9,337,288 B2
(45) Date of Patent: May 10, 2016

(54) METHOD OF MANUFACTURING MOS-TYPE SEMICONDUCTOR DEVICE

(71) Applicant: FUJI ELECTRIC CO., LTD., Kawasaki-shi (JP)

(72) Inventors: Shuhei Tatemichi, Matsumoto (JP); Takeyoshi Nishimura, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/455,347

(22) Filed: Aug. 8, 2014

(65) Prior Publication Data

US 2015/0056776 A1    Feb. 26, 2015

(30) Foreign Application Priority Data

Aug. 20, 2013   (JP) ................. 2013-170698

(51) Int. Cl.

| | |
|---|---|
| *H01L 29/423* | (2006.01) |
| *H01L 29/10* | (2006.01) |
| *H01L 29/08* | (2006.01) |
| *H01L 29/66* | (2006.01) |
| *H01L 21/02* | (2006.01) |
| *H01L 21/265* | (2006.01) |

(52) U.S. Cl.
CPC .... *H01L 29/42364* (2013.01); *H01L 21/02238* (2013.01); *H01L 21/02255* (2013.01); *H01L 29/0856* (2013.01); *H01L 29/1095* (2013.01); *H01L 29/66712* (2013.01); *H01L 21/2652* (2013.01); *H01L 21/26586* (2013.01)

(58) Field of Classification Search
USPC .................................................. 438/299, 302
See application file for complete search history.

(56) References Cited

U.S. PATENT DOCUMENTS

| | | | | |
|---|---|---|---|---|
| 5,981,347 | A | * | 11/1999 | Kuo et al. .................... 438/308 |
| 2002/0117711 | A1 | | 8/2002 | Yoneda |
| 2005/0045960 | A1 | | 3/2005 | Takahashi |
| 2007/0235804 | A1 | * | 10/2007 | Watanabe ......... H01L 29/66325 257/347 |
| 2009/0261351 | A1 | * | 10/2009 | Das ..................... H01L 29/0873 257/77 |

FOREIGN PATENT DOCUMENTS

| | | | | |
|---|---|---|---|---|
| JP | H06-244428 | A | | 9/1994 |
| JP | H06-244428 | A | * | 9/1994 ............. H01L 29/784 |
| JP | 2000-228520 | A | | 8/2000 |
| JP | 2005-101514 | A | | 4/2005 |

OTHER PUBLICATIONS

Kobayashi, Takashi. JP Patent Publication No. 06-244428. "MOS Device and Manufacture Thereof."*

* cited by examiner

*Primary Examiner* — Yu-Hsi D Sun
*Assistant Examiner* — Mikka Liu
(74) *Attorney, Agent, or Firm* — Rabin & Berdo, P.C.

(57) ABSTRACT

A method of manufacturing a MOS-type semiconductor device capable of increasing the thickness of a gate oxide film and obtaining high gate withstanding power and reduced switching loss without increasing a gate threshold voltage Vth is provided. A p-type well region is selectively formed on one principle surface of a semiconductor substrate having an n-type low impurity concentration layer by using an oxide film as a mask. Subsequently, a resist mask is formed on the surface of the p-type well region so as to be separated from the oxide film mask, and an n⁺-type source region is selectively formed from the separation portion. Subsequently, the oxide film mask is removed. Then, an oxide film is formed on the surface of the p-type well region, and the oxide film is removed. Subsequently, a gate electrode coated with a gate oxide film is formed on the surface of the semiconductor substrate.

12 Claims, 26 Drawing Sheets

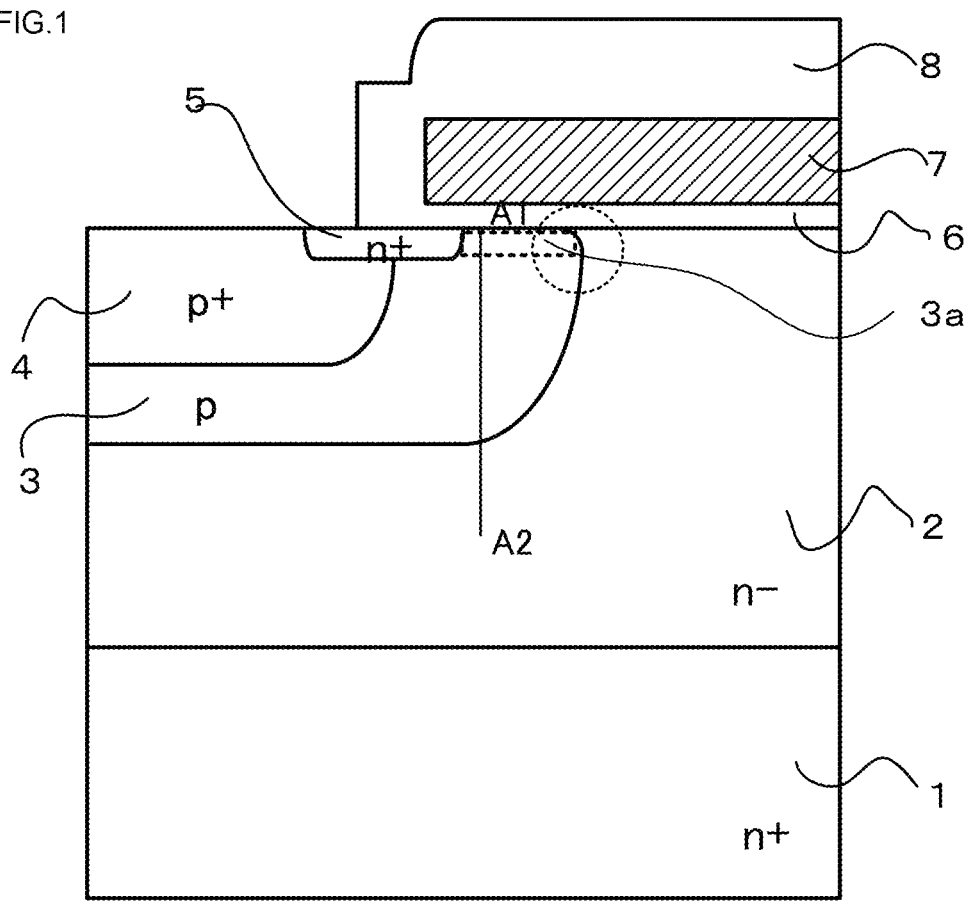

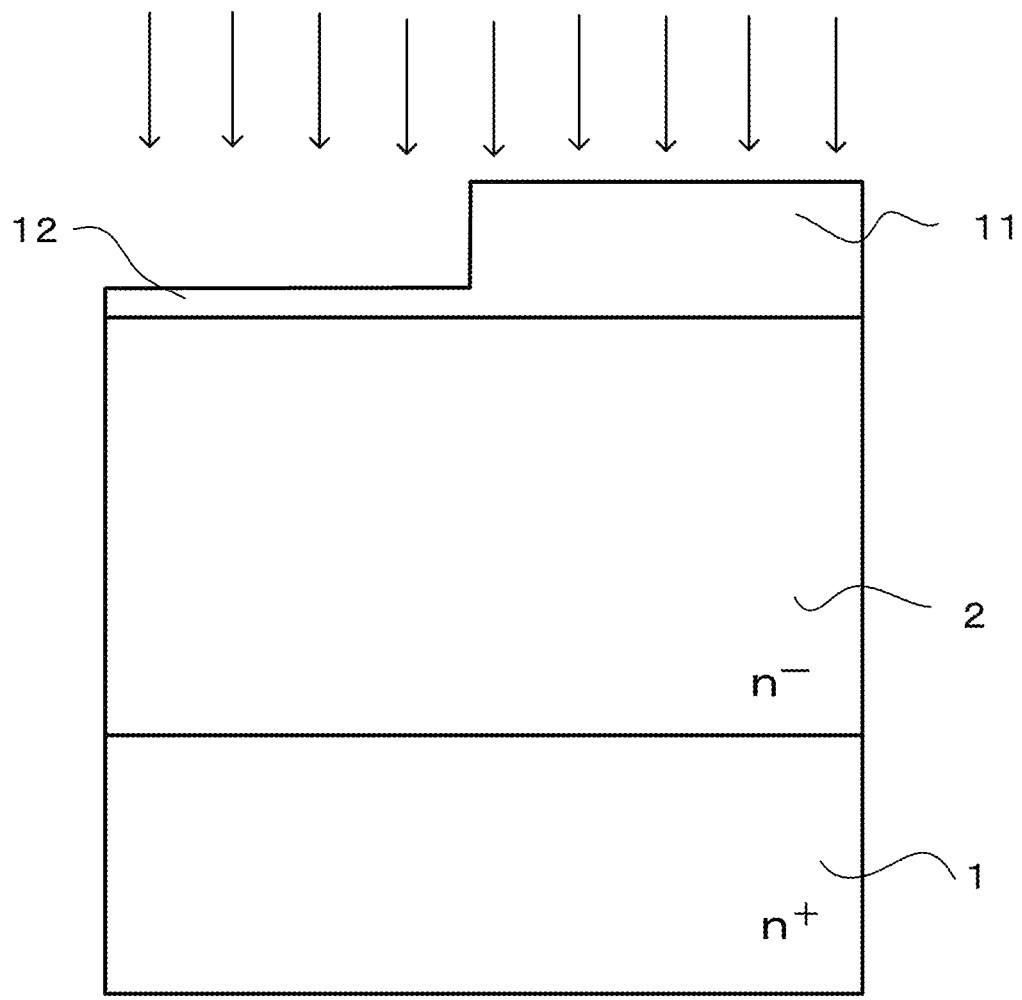

RELATED ART

FIG.19

(b1) OXIDE FILM MASK FORMING STEP (b2) WELL REGION AND SOURCE REGION FORMING STEP (b3) OXIDE FILM MASK REMOVING STEP (b4) CONCENTRATION ADJUSTMENT AND OXIDATION STEP (b5) OXIDE FILM REMOVING STEP (b6) GATE OXIDE FILM FORMING STEP (b7) GATE ELECTRODE FORMING STEP (a1)

(a2)

(a3)

RELATED ART

METHOD OF MANUFACTURING MOS-TYPE SEMICONDUCTOR DEVICE

BACKGROUND OF THE INVENTION

1. Field of the Invention

The present invention relates to a method of manufacturing a MOS-type semiconductor device.

2. Description of the Related Art

FIG. 20 illustrates a cross-sectional view of a main portion including a surface MOS structure of a conventional power MOSFET which is one of general MOS-type semiconductor devices. A p-type well region 103 is formed on a surface layer of a semiconductor substrate (including an $n^+$-type low-resistance semiconductor substrate 101 and an $n^-$-type drift layer 102) of a MOSFET, and an $n^+$-type source region 105 is formed thereon. The surface of the p-type well region 103 is sandwiched between the $n^+$-type source region 105 and the surface of the $n^-$-type drift layer 102. A gate electrode 107 formed of a polysilicon film or the like is stacked on the surface with a gate oxide film 106 interposed therebetween. Such a structure is referred to as a MOS gate structure or a surface MOS structure.

When a gate voltage equal to or higher than a threshold voltage is applied between the gate electrode 107 and a source electrode (not illustrated), an n-type inversion layer 103a in which electrons are accumulated is formed at the interface between the p-type well region 103 and the gate oxide film 106. The n-type inversion layer 103a becomes a passage for electrons connecting the source region and the $n^-$-type drift layer 102 in the n-type region and is referred to as an n-channel. This n-channel provides a control function of turning the device on and off.

On the other hand, an active portion where a main current flows is formed in individual MOSFETs (device chips) arranged in a semiconductor wafer. In this active portion, a plurality of unit cells which uses the surface MOS structure as its unit cell is evenly distributed in the surface of the active portion and is arranged in parallel. In the individual MOSFET chip which is a device chip, the currents flowing through the respective unit cells are gathered in a metal electrode film that makes contact with the surfaces of a plurality of unit cells and output.

In a minimum unit cell that constitutes the surface MOS structure, the following parameters are known as factors that determine the characteristics of a MOS gate. Regarding the surface of the p-type well region 103, the length (the distance in the current flowing direction, also referred to as a channel length) of the channel forming region 103a and a surface impurity concentration thereof are the parameters. These parameters determine a gate threshold voltage with together with the thickness of the gate oxide film 106 provided on the surface of the channel forming region. The gate threshold voltage Vth is an important device design factor because this voltage directly influences the ON-resistance of a MOSFET. These parameters are determined carefully so that the parameters are maintained to be constant within the surface of the active portion with as little unevenness as possible. This is because the currents in unit cells are added in parallel to become a main current. That is, in order to allow the current to flow through the surface of the active portion of the MOSFET with as little unevenness as possible, it is preferable that all the currents in the respective unit cells flow with the same current density.

As thus explained, as a method of forming unit cells of the surface MOS structure as uniform as possible, a manufacturing method which employs self-alignment is known. This method eliminates a mask shift by forming a gate electrode formed of a polysilicon so that the end of the gate electrode is located at the end of an ion implantation region of the p-type well region 103 and the $n^+$-type source region 105. An outline of a conventional manufacturing method (self-alignment method) will be described with reference to FIGS. 21 to 27 and FIG. 29. FIG. 29 is a schematic flowchart of the manufacturing process, and FIGS. 21 to 27 are cross-sectional views of a main portion including a surface MOS structure, illustrating the respective process steps.

A gate oxide film 106 is formed on an $n^-$-type drift layer 102 formed of an n-type silicon semiconductor (step a1 of FIG. 29). Subsequently, a polysilicon film is formed on the gate oxide film 106, and etching is performed to obtain a necessary pattern, whereby a gate electrode 107 is formed (step a2).

Subsequently, boron ions are implanted using the gate electrode 107 as a mask (see FIG. 21), and an annealing process is performed to form a p-type well region 103 (see FIG. 22). Subsequently, a resist mask is formed on the gate electrode 107, and boron ions are implanted to form a $p^+$-type contact region 104 (see FIG. 23). The resist mask is removed (see FIG. 24), a new resist mask 110 for forming an $n^+$-type source region is formed, and arsenic ions are implanted (see FIG. 25) to form an $n^+$-type source region 105 (see FIG. 26). Up to now, step a3 of FIG. 29 has been described.

When an interlayer insulating film 108 is formed so as to cover the gate electrode 107, a surface MOS structure is obtained (see FIG. 27). The p-type well region 103 and the $n^+$-type source region 105 are formed by implanting ions using the same gate electrode 107 as a mask. Due to this, since a shift resulting from mask alignment is obviated, self-alignment is realized.

When the p-type well region 103 and the $n^+$-type source region 105 are formed by the self-alignment method in this manner, since the channel length can be made uniform, the current flows uniformly through the surface of the active portion, and unevenness of the heating due to the current can be suppressed.

Moreover, Japanese Patent Application Publication No. H6-244428 discloses a method of forming a p-type well region and an $n^+$-type source region using a thick oxide film as a mask rather than using a gate electrode, which also uses the self-alignment method. An outline of this method will be described with reference to FIGS. 28A to 28F which are cross-sectional views of a main portion including a surface MOS structure, illustrating the process steps.

An oxide film mask 111 is formed on an $n^-$-type drift layer 102 formed of an n-type silicon semiconductor. Subsequently, boron ions are implanted using the oxide film mask 111 as a mask (see FIG. 28A), and an annealing process is performed to form a p-type well region 103 (see FIG. 28B). Subsequently, a resist mask is formed on the oxide film mask 111, and boron ions are implanted to form a $p^+$-type contact region 104 (see FIG. 28C). The resist mask is removed (see FIG. 28D), a new resist mask 110 for forming an $n^+$-type source region is formed, and arsenic ions are implanted (see FIG. 28E) to form an $n^+$-type source region 105 (see FIG. 28F). After that, the oxide film mask 111 is removed completely (see FIG. 28G). Then, when a gate oxide film 106 and an interlayer insulating film 108 covering the gate electrode 107 are formed, the surface MOS structure is obtained (see FIG. 28H). The p-type well region 103 and the $n^+$-type source region 105 are formed by implanting ions using the same oxide film mask 111 as a mask. Due to this, since a shift resulting from mask alignment is obviated, self-alignment is realized.

Japanese Patent Application Publication No. 2000-228520 discloses a technique of decreasing an impurity concentration of the channel forming region 103a in the p-type well region 103. According to this technique, first, a thick trench sidewall oxide film is formed on sidewalls of a trench as a post-treatment of trench sidewalls after trench etching, of a trench gate-type MOS transistor. Then, the oxide film is removed and a gate oxide film is formed. By doing so, the surface impurity concentration of a p-type base region (the same as the p-type well region) close to the trench sidewalls only can be decreased by taking advantage of impurities taken into the thick trench sidewall oxide film. Moreover, a threshold voltage can be decreased without decreasing withstanding power or the like of the device.

As described above, in the conventional method, the channel forming region 103a becomes the passage of a main current during the ON time, the channel forming region 103a is formed by the self-alignment method in order to maintain the resistance values of the channels distributed on the surface of the active portion of the MOSFET without any variation.

In general, a gate threshold voltage with of a MOSFET is determined by the thickness of the gate oxide film and a surface impurity concentration (hereinafter, an impurity concentration is sometimes referred to simply as a concentration) of the p-type well region 103. FIG. 17 is a diagram illustrating the relation between a gate oxide film and a gate threshold voltage Vth of a MOS-type semiconductor device having a general surface MOS structure. For example, if the surface impurity concentration of the p-type well region 103 is constant, the gate threshold voltage is determined by the gate oxide film thickness as illustrated in FIG. 17. The same is true for the gate oxide film. On the other hand, with regard to the gate threshold voltage Vth, the thickness of the gate oxide film and the surface impurity concentration of the p-type well region 103 have a trade-off relation.

On the other hand, a net doping concentration distribution of a region along line B1-B2 of a MOSFET illustrated in FIG. 20 shows such an oblique distribution that the concentration decreases gradually with a diffusion distance in the depth direction and a planar direction of the semiconductor substrate from the ion implantation region. In this case, the gate threshold voltage Vth is determined by the surface impurity concentration of the p-type well region 103 (the channel forming region 103a) near the junction terminal surface of the n$^+$-type source region 105, in particular.

As described above, when the gate oxide film 106 is thick, by decreasing the surface impurity concentration near the n$^+$-type source region 105 of the p-type well region 103 (the channel forming region 103a), it is possible to suppress an increase in the gate threshold voltage Vth.

However, when the surface impurity concentration of the p-type well region 103 is decreased, the entire concentration of the p-type well region 103 may also decrease. Thus, since the surface impurity concentration is closely related to other semiconductor characteristics such as a withstanding voltage or an ON-resistance of MOSFET, there is substantially no room for decreasing the surface impurity concentration. Therefore, it is difficult to decrease the thickness of the gate oxide film without increasing the gate threshold voltage, and there is a limit on decreasing the same.

Further, when the surface impurity concentration of the channel forming region 103a decreases, a depletion layer on the surface may extend too long, which make a short-channel effect occur easily and a parasitic bipolar transistor operate easily. Specifically, when the surface impurity concentration of the p-type well region 103 (the channel forming region 103a) is decreased in FIG. 20, it is possible to decrease the gate threshold voltage Vth. However, a low gate threshold voltage makes a parasitic transistor (a region indicated by reference numerals 105, 103, and 102) conductive easily, which makes it difficult to perform control with the gate. Further, in an OFF state, the depletion layer can easily spread in the channel forming region 103a, which may cause punch-through breakdown.

SUMMARY OF THE INVENTION

An object of the present invention is to solve the problems described above and to provide a method of manufacturing a MOS-type semiconductor device capable of increasing the thickness of a gate oxide film and obtaining high gate withstanding power and reduced switching loss without increasing a gate threshold voltage Vth.

In order to solve the problems and attain the object of the present invention, the present invention provides a method of manufacturing a MOS-type semiconductor device, including: an oxide film forming step of forming a first thermal oxide film on one principal surface of a drift layer of a first conductivity type and patterning the first thermal oxide film; a well region forming step of selectively implanting impurity ions of a second conductivity type by using the first thermal oxide film as a mask and performing a heat treatment to form a well region of a second conductivity type having a higher impurity concentration than the drift layer; a source region forming step of providing a first resist film on a surface of the well region so as to be separated from the first thermal oxide film, implanting impurity ions of a first conductivity type by using the first resist film and the first thermal oxide film as a mask, removing the first resist film, and performing a heat treatment to form a source region of a first conductivity type having a higher impurity concentration than the well region; a second oxide film forming and removing step of removing the first thermal oxide film, forming a second thermal oxide film, and removing the second thermal oxide film; and a MOS gate forming step of forming a gate oxide film so as to cover the surfaces of the source region, the well region, and the drift layer which are adjacent to each other and forming a gate electrode on a surface of the gate oxide film.

The method may further include: subsequently to the source region forming step, a contact region forming step of providing a second resist film on the surface of the well region so as to be separated from the thermal oxide film, and implanting impurity ions of a second conductivity type by using the second resist film and the first thermal oxide film as a mask, removing the second resist film, and performing a heat treatment to form a contact region of a second conductivity type having a higher impurity concentration than the well region. In the oxide film forming step, when the first thermal oxide film is etched, a tapered surface may be formed on an edge of the first thermal oxide film.

In the oxide film forming step, after the tapered surface is formed on the thermal oxide film, ion implantation may be performed at an oblique angle equal to or smaller than an angle vertical to the tapered surface.

The semiconductor device may be a MOSFET.

In the second oxide film forming and removing step, a portion of the impurities of the second conductivity type on the surface of the well region may be segregated into the second thermal oxide film, and a concentration of impurities of the second conductivity type on the surface of the well region may decrease as compared to that before the second oxide film forming and removing step.

According to the present invention, it is possible to manufacture a MOS-type semiconductor device having a thick gate oxide film without increasing the threshold voltage Vth. Moreover, when the thickness of the gate oxide film is increased, the intensity of electric field applied to the gate oxide film decreases, the reliability of the gate oxide film is improved. Moreover, the use of a thick gate oxide film makes it possible to provide a method of manufacturing a MOS-type semiconductor device in which switching loss can be reduced due to reduction in gate capacitance.

BRIEF DESCRIPTION OF THE DRAWINGS

FIG. 1 is a cross-sectional view of a main part of a MOS structure of a MOSFET according to the present invention;

FIG. 3 is a first cross-sectional view of a main portion of a semiconductor substrate, illustrating the steps of manufacturing a surface MOS structure of a MOSFET according to Example 1 of the present invention;

FIG. 19 is a flowchart illustrating the steps of manufacturing a surface MOS structure portion according to the present invention;

DETAILED DESCRIPTION

Figure 2A:
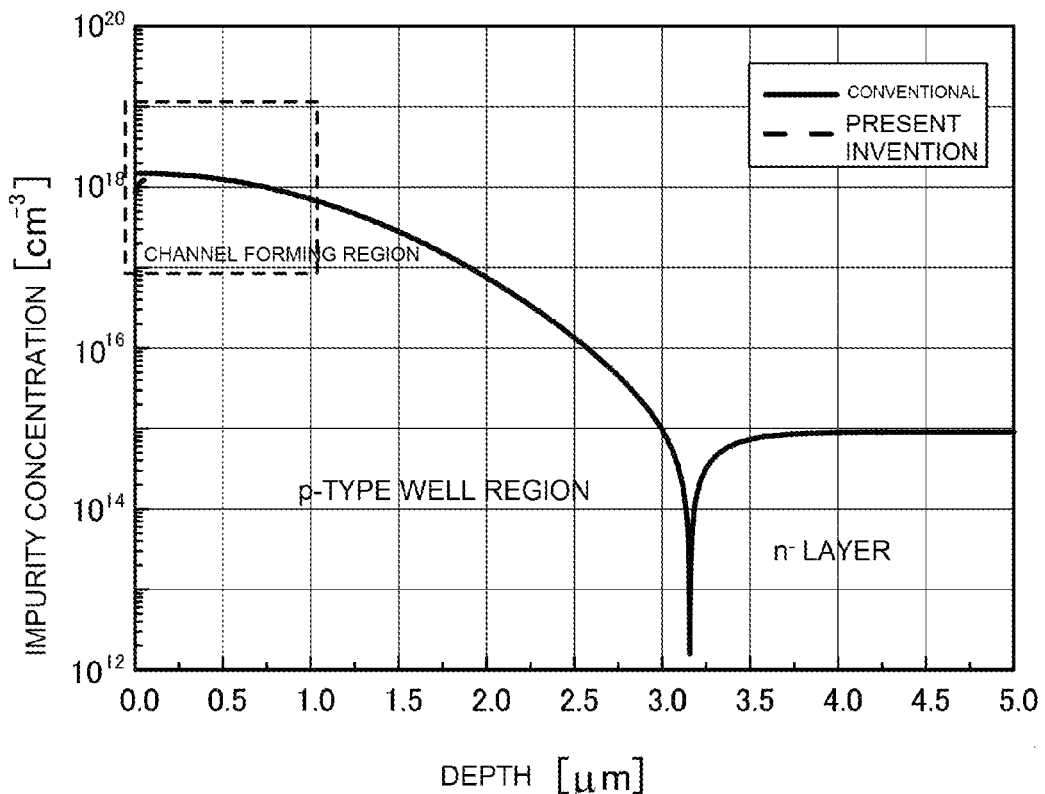
FIGS. 2A and 2B are diagrams illustrating net impurity concentration distributions in regions along lines A1-A2 and B1-B2 of MOSFETs according to the present invention and the conventional technique illustrated in FIG. 1 and FIG. 20, respectively.

Hereinafter, examples of a method of manufacturing a MOS-type semiconductor device according to the present invention will be described in detail with reference to the drawings. In the present specification and the accompanying drawings, layers or regions with letters "n" and "p" have electrons and holes as their majority carriers, respectively. Moreover, layers or regions with signs "+" and "−" attached to the letters "n" and "p" have relatively high and low impurity concentrations, respectively. In the description of the following examples and the accompanying drawings, the same constituent components are denoted by the same reference numerals. Moreover, the accompanying drawings described in the examples are not drawn to the exact scales and dimensional ratios to make the drawings easy to be visible and understood.

Example 1

FIG. 1 illustrates a cross-sectional view of a main portion including a surface MOS structure of a power MOSFET which is one of MOS-type semiconductor devices according to the present invention. FIGS. 3 to 10 are cross-sectional views of a main portion of a semiconductor substrate, illustrating the steps of manufacturing an n-channel MOSFET as one example of a method of manufacturing a MOS-type semiconductor device according to the present invention. FIG. 19 is a flowchart illustrating the steps of the manufacturing method according to the present invention.

A thick field oxide film 11 is thermally oxidized so as to grow on a surface of a silicon semiconductor substrate. The silicon semiconductor substrate is a stacked layer including an $n^+$-type low-resistance semiconductor substrate 1 and an $n^-$-type drift layer 2. Photolithography and oxide film etching is performed to form an oxide film mask having an opening pattern for forming a p-type well region. Up to now, an oxide film mask forming step b1 of FIG. 19 has been described.

Subsequently, a thin screen oxide film 12 is formed in the openings. In the case of thermal oxidation, the screen oxide film 12 is formed on the surface of the substrate including the openings. Subsequently, boron ions ($B^+$) 13 are implanted with such acceleration energy that the ions pass through the thin screen oxide film 12 only (see FIG. 3). Subsequently, a p-type well region 3 having a predetermined depth is formed by thermal diffusion (see FIG. 4). After that, photolithography is performed to form a resist mask 14 and boron ions 13 ($B^+$) are implanted with appropriate acceleration energy (see FIG. 5). Subsequently, the resist mask 14 is removed and an annealing process is performed, whereby a $p^+$-type contact region 4 having a surface impurity concentration is formed such that an ohmic contact is obtained when a source electrode is deposited in a subsequent step (see FIG. 6).

After that, photolithography is performed again to selectively form a resist mask 15. Arsenic ions 16 ($As^+$) are implanted into the opening between the resist mask 15 and the field oxide film mask 11 with such acceleration energy that the ions pass through the screen oxide film 12 (see FIG. 7). Subsequently, the resist mask 15 is removed and an annealing process is performed to form an $n^+$-type source region (see FIG. 8). In this manner, an end portion of the field oxide film 11 used as the mask can be formed as an end portion of the ion implantation opening of the p-type well region 3 and the $n^+$-type source region 5. As a result, the position of the $n^+$-type source region 5 in the p-type well region 3 is self-aligned by the field oxide film mask 11. Up to now, a well and source region forming step b2 of FIG. 19 has been described. As described above, step b2 may include a step of forming the $p^+$-type contact region 4.

Subsequently, the screen oxide film 12 and the field oxide film mask 11 are removed by etching. This is an oxide film mask removing step b3 of FIG. 19.

Figure 9:
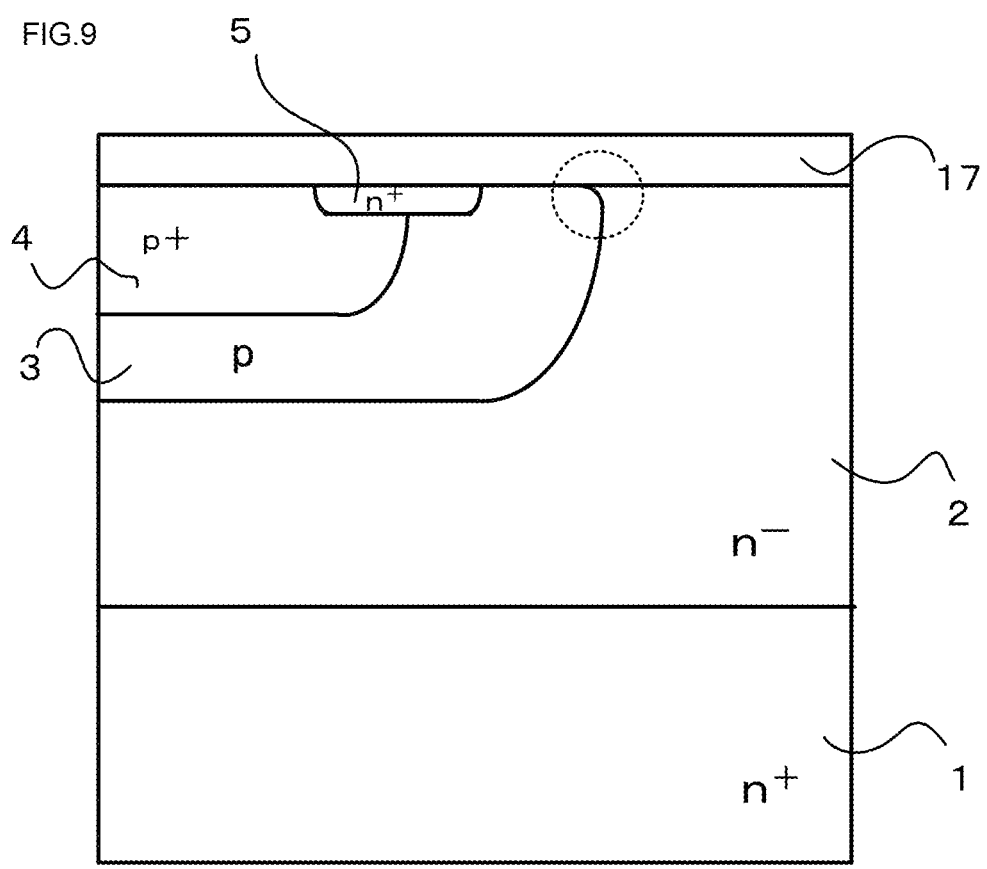
FIG. 9 is a seventh cross-sectional view of a main portion of a semiconductor substrate, illustrating the steps of manufacturing a surface MOS structure of a MOSFET according to Example 1 of the present invention.

Subsequently, an oxide film 17 is grown again on the surface where the oxide film is removed (see FIG. 9). Boron on the surface of the p-type well region 3 is segregated out by an oxidation step for forming the oxide film 17, whereby the surface impurity concentration of the p-type well region 3 (channel forming region) only can be decreased. This step is a key feature of the present invention and is a concentration adjustment and oxidation step b4 of FIG. 19. That is, by adjusting oxidation conditions to control the amount of segregated boron, a necessary surface impurity concentration of the p-type well region 3 (channel forming region) can be obtained. In a conventional manufacturing method in which a p-type well region and an $n^+$-type source region are self-aligned by a gate oxide film and a gate electrode which have already been formed, it is practically impossible to adjust the threshold voltage by boron segregation into oxide. Similarly to the invention of the present application, the above is a means that enables the threshold voltage to be adjusted since self-alignment is realized using the oxide film mask.

Subsequently, the oxide film 17 is removed by etching. This step is an oxide film removing step b5 of FIG. 19.

Subsequently, an oxide film 6 serving as an gate oxide film is formed on the surface of the silicon semiconductor substrate where the oxide film is removed. This step is a gate oxide film forming step b6 of FIG. 19.

Subsequently, a polysilicon film is formed on an upper surface of the gate oxide film 6 and photolithography and etching is performed to form a gate electrode 7. This step is a gate electrode forming step b7 of FIG. 19.

Figure 10:
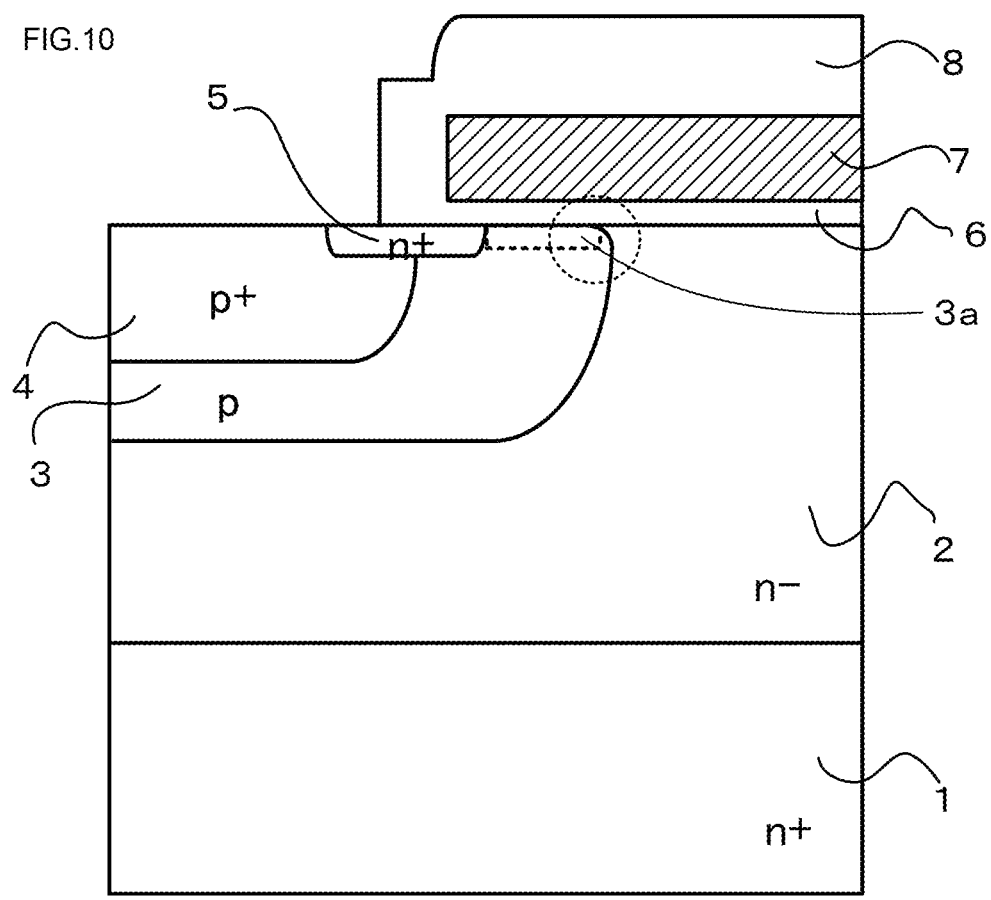
FIG. 10 is an eighth cross-sectional view of a main portion of a semiconductor substrate, illustrating the steps of manufacturing a surface MOS structure of a MOSFET according to Example 1 of the present invention.

After that, a process of depositing a new insulating layer, performing photolithography and etching to perform patterning to form an interlayer insulating film 8 is performed, which is a wafer process of the MOSFET according to Example 1 (see FIG. 10).

Figure 2B:
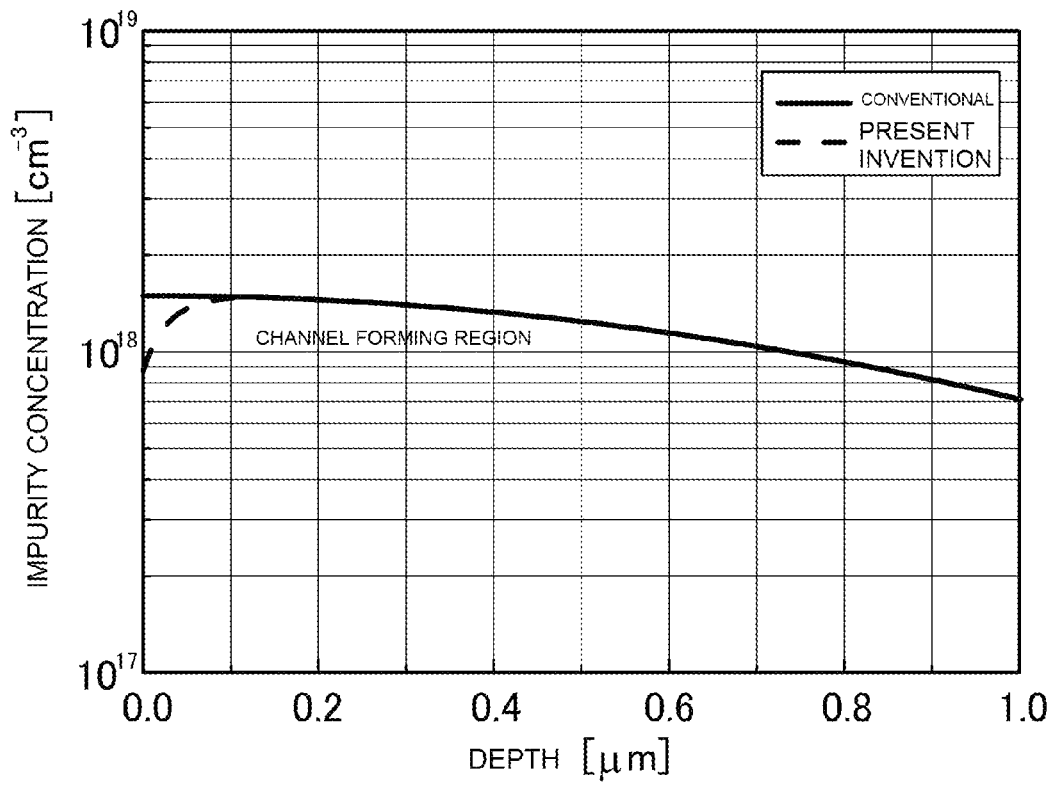
Figure 4:
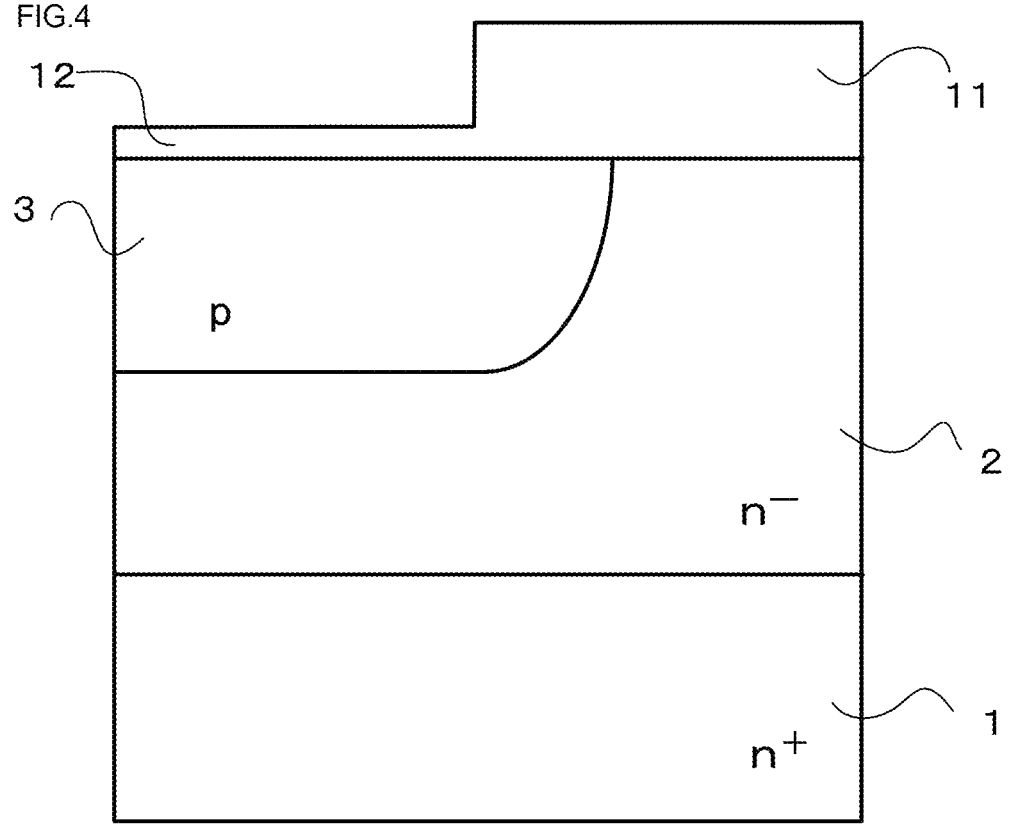
FIG. 4 is a second cross-sectional view of a main portion of a semiconductor substrate, illustrating the steps of manufacturing a surface MOS structure of a MOSFET according to Example 1 of the present invention.
Figure 5:
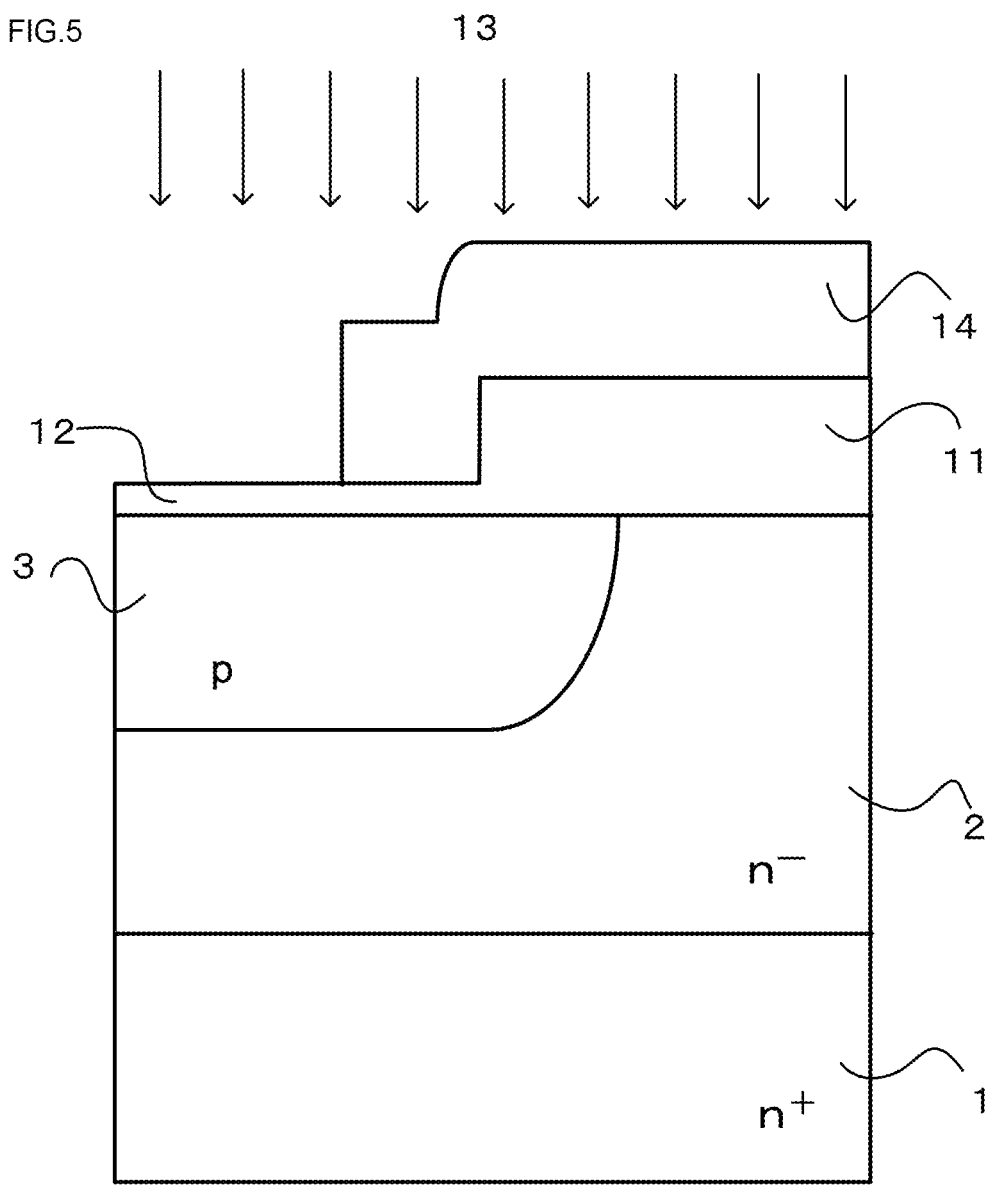
FIG. 5 is a third cross-sectional view of a main portion of a semiconductor substrate, illustrating the steps of manufacturing a surface MOS structure of a MOSFET according to Example 1 of the present invention.
Figure 6:
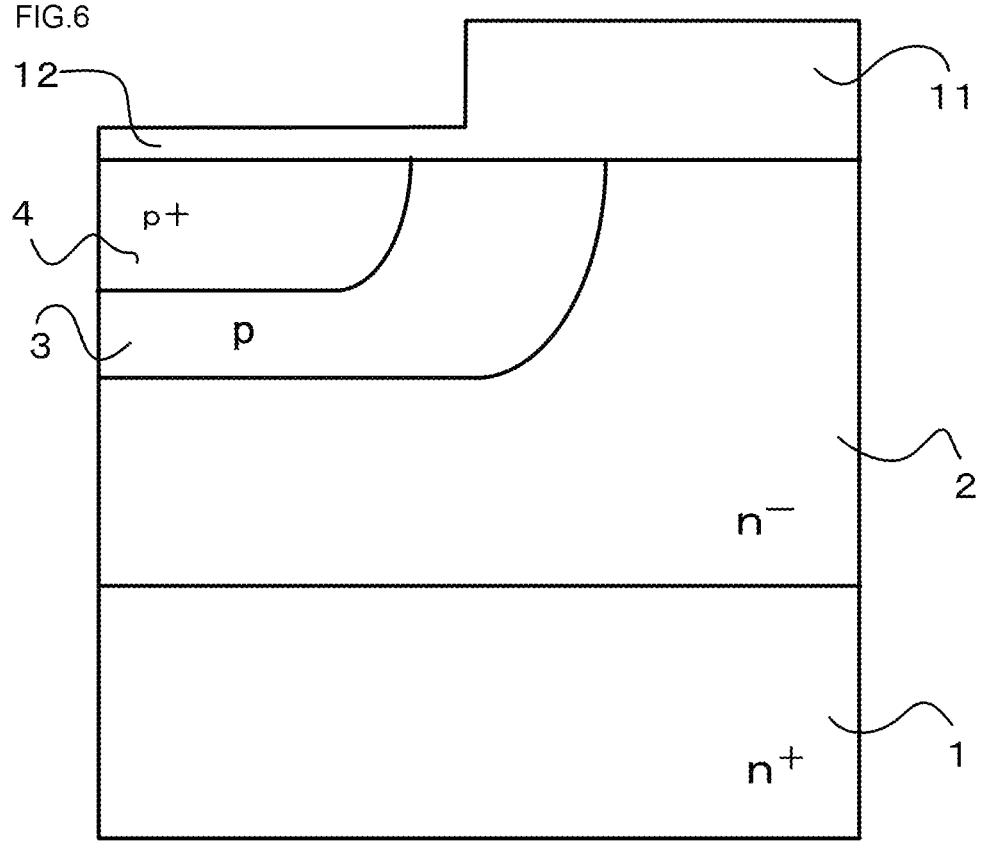
FIG. 6 is a fourth cross-sectional view of a main portion of a semiconductor substrate, illustrating the steps of manufacturing a surface MOS structure of a MOSFET according to Example 1 of the present invention.
Figure 7:
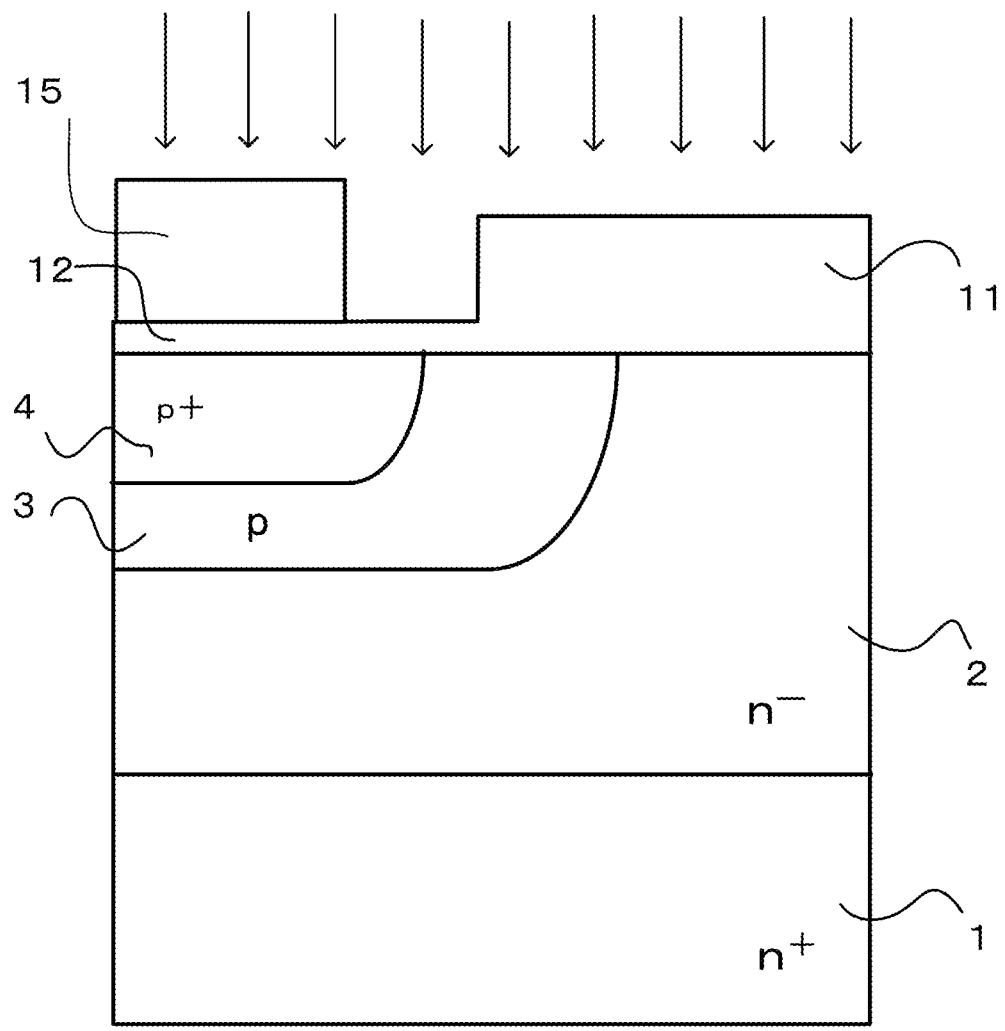
FIG. 7 is a fifth cross-sectional view of a main portion of a semiconductor substrate, illustrating the steps of manufacturing a surface MOS structure of a MOSFET according to Example 1 of the present invention.
Figure 8:
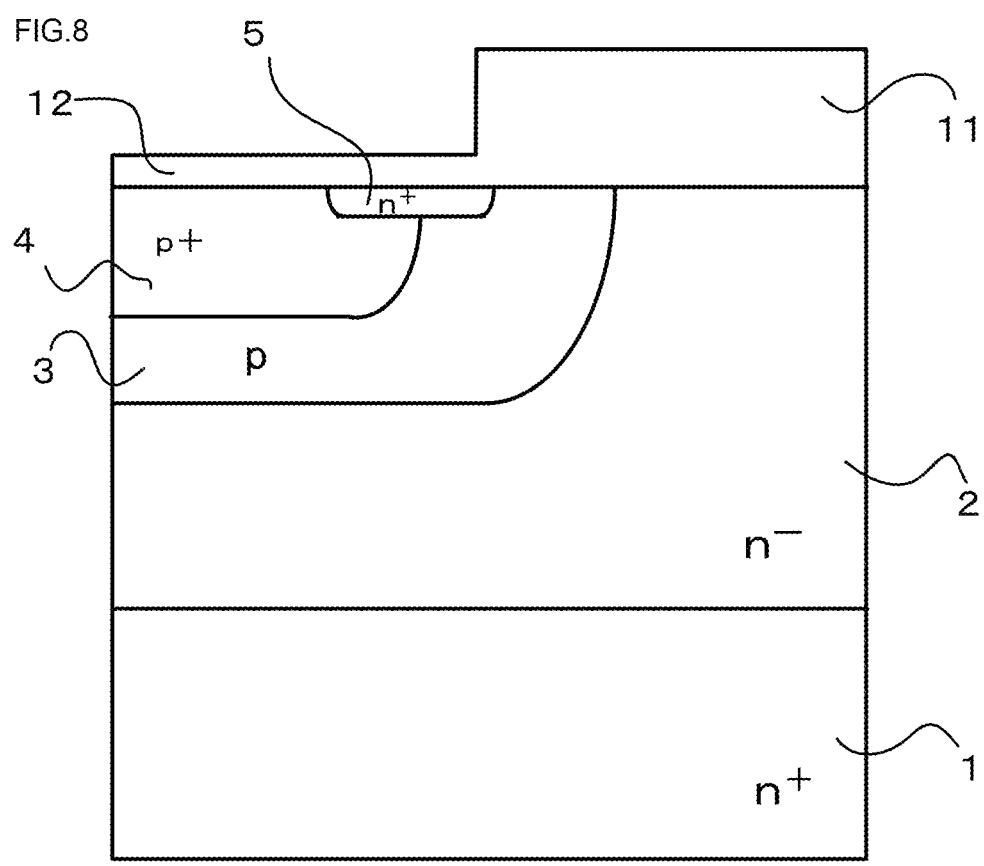
FIG. 8 is a sixth cross-sectional view of a main portion of a semiconductor substrate, illustrating the steps of manufacturing a surface MOS structure of a MOSFET according to Example 1 of the present invention.
Figure 20:
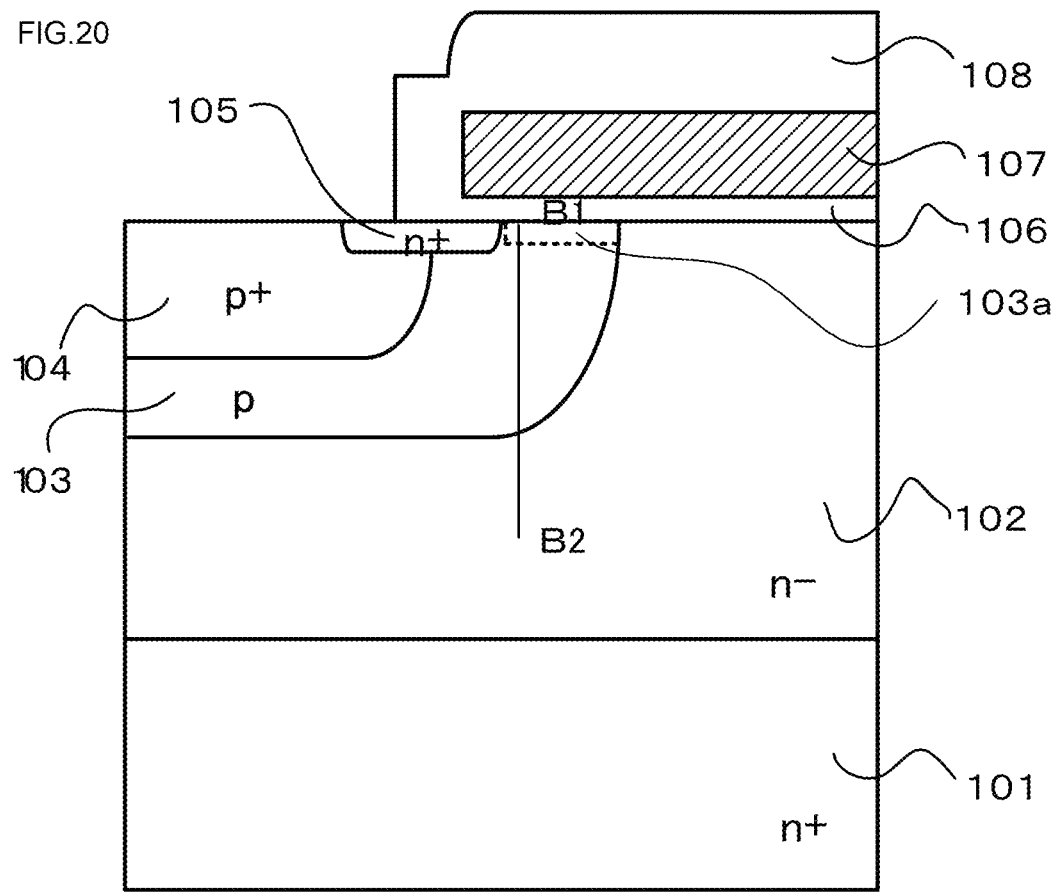
FIG. 20 is a cross-sectional view of a portion that includes a surface MOS structure of a power MOSFET according to the conventional technique.
Figure 21:
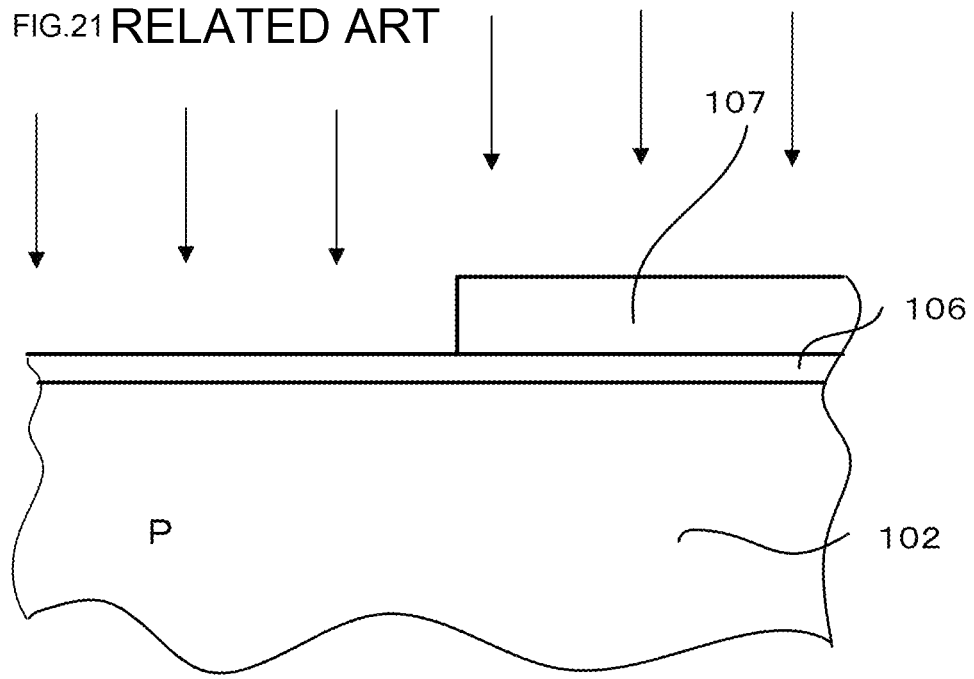
FIG. 21 is a first cross-sectional view of a main portion of a semiconductor substrate, illustrating the steps of manufacturing a surface MOS structure of a MOSFET according to the conventional technique.
Figure 22:
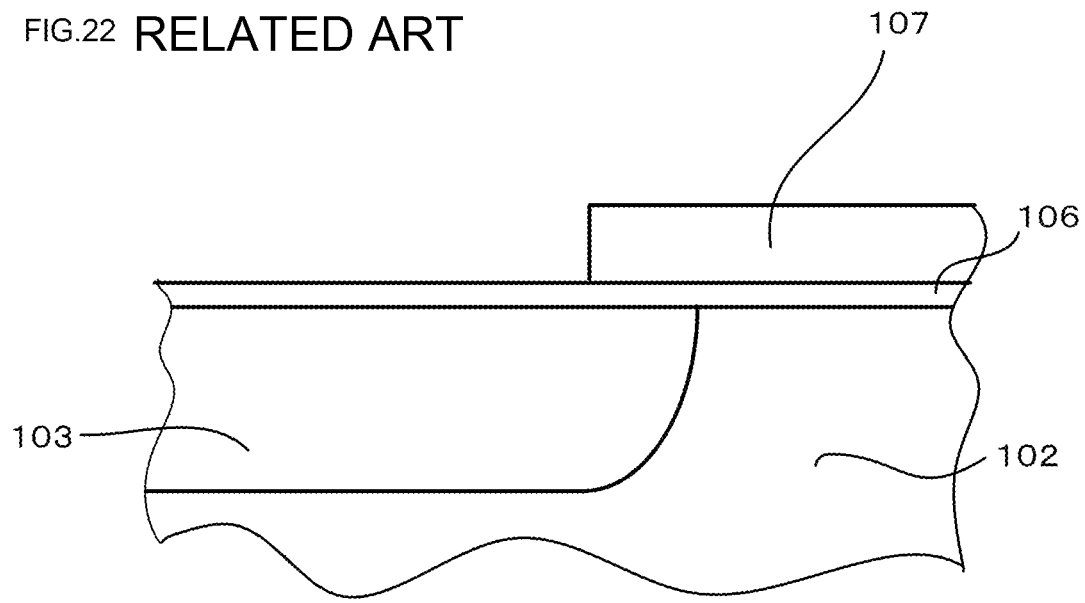
FIG. 22 is a second cross-sectional view of a main portion of a semiconductor substrate, illustrating the steps of manufacturing a surface MOS structure of a MOSFET according to the conventional technique.
Figure 23:
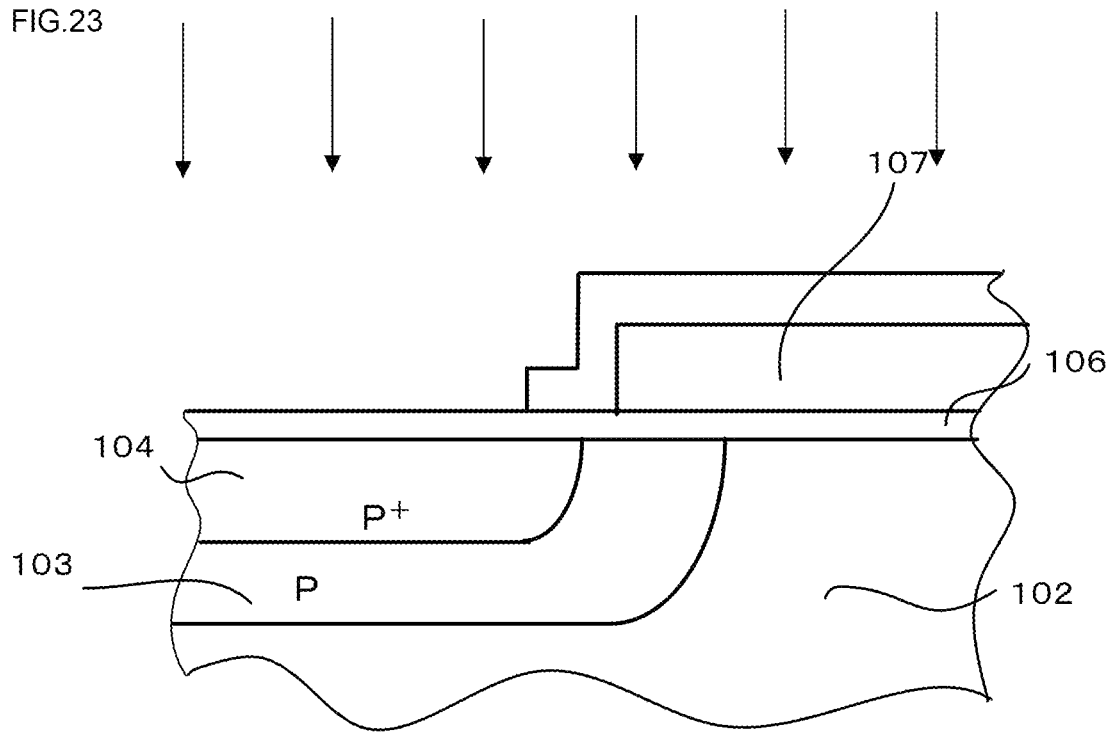
FIG. 23 is a third cross-sectional view of a main portion of a semiconductor substrate, illustrating the steps of manufacturing a surface MOS structure of a MOSFET according to the conventional technique.
Figure 24:
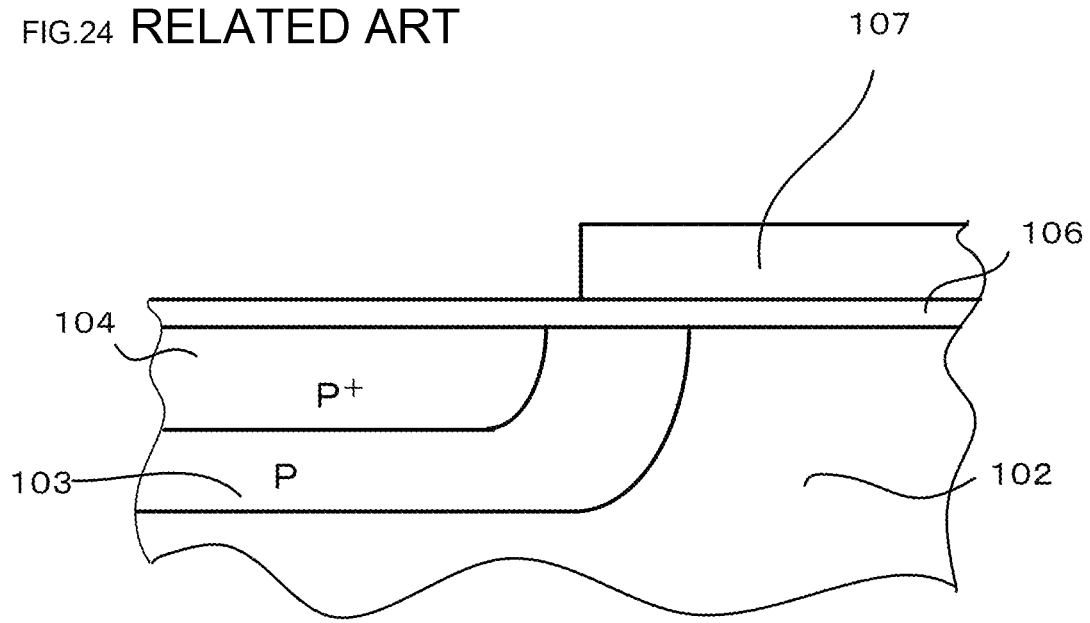
FIG. 24 is a fourth cross-sectional view of a main portion of a semiconductor substrate, illustrating the steps of manufacturing a surface MOS structure of a MOSFET according to the conventional technique.
Figure 25:
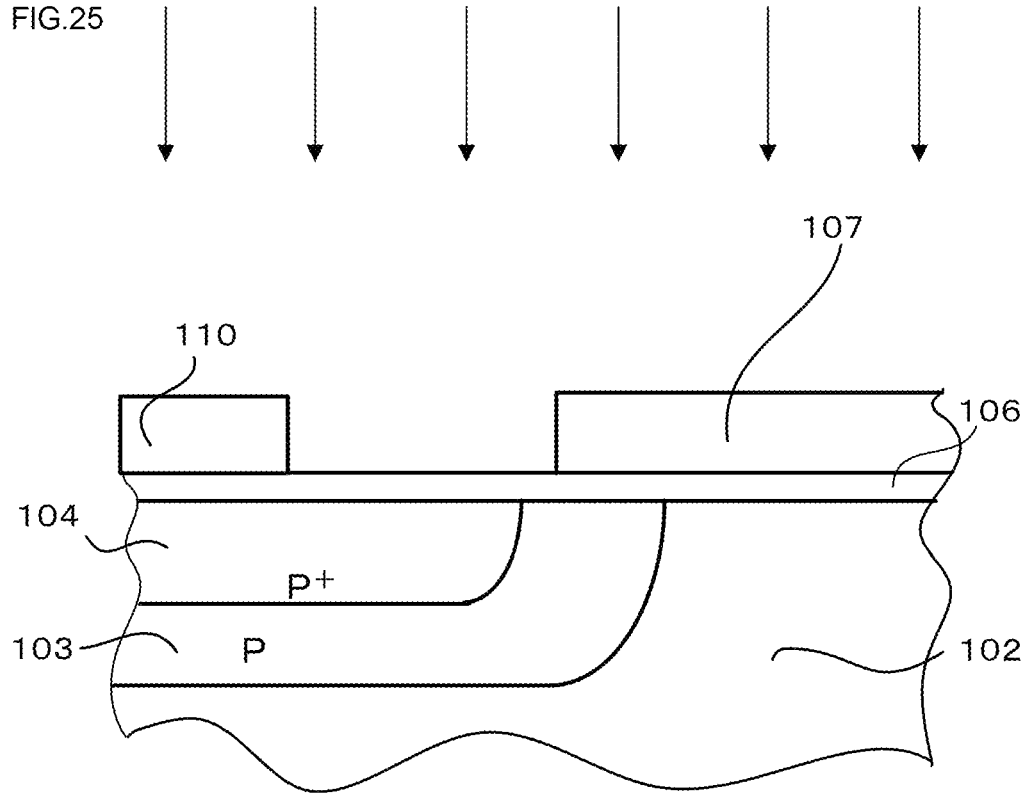
FIG. 25 is a fifth cross-sectional view of a main portion of a semiconductor substrate, illustrating the steps of manufacturing a surface MOS structure of a MOSFET according to the conventional technique.
Figure 26:
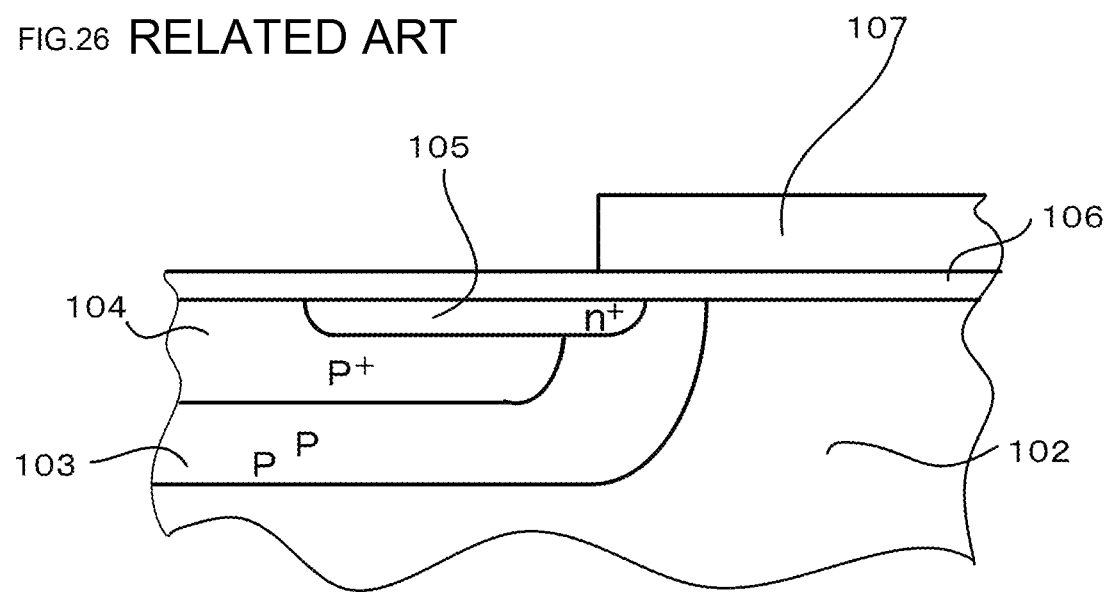
FIG. 26 is a sixth cross-sectional view of a main portion of a semiconductor substrate, illustrating the steps of manufacturing a surface MOS structure of a MOSFET according to the conventional technique.
Figure 27:
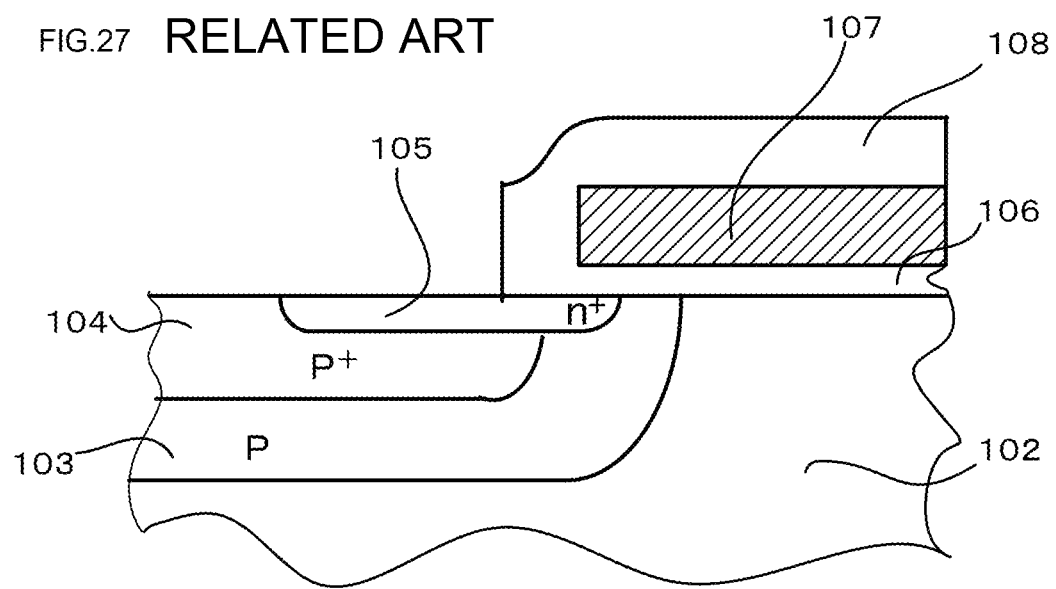
FIG. 27 is a seventh cross-sectional view of a main portion of a semiconductor substrate, illustrating the steps of manufacturing a surface MOS structure of a MOSFET according to the conventional technique.
Figure 28A:
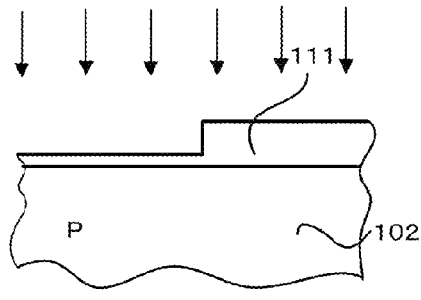
FIGS. 28A to 28H are cross-sectional views of a main part of a semiconductor substrate, illustrating the flow of steps of manufacturing a surface MOS structure of a MOSFET according to the conventional technique.
Figure 28B:
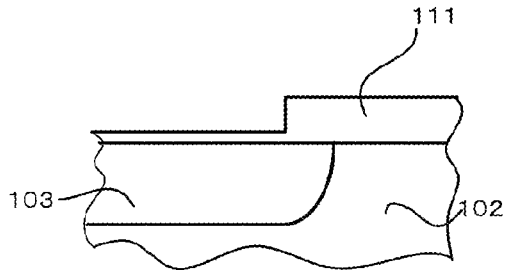
Figure 28C:
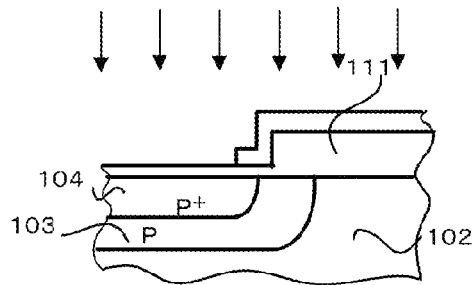
Figure 28D:
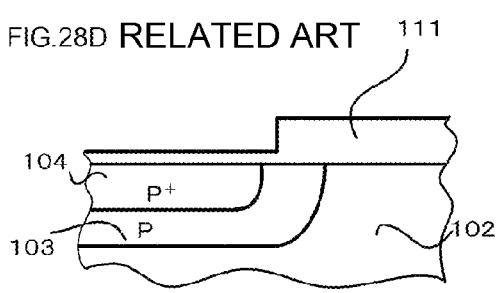
Figure 28E:
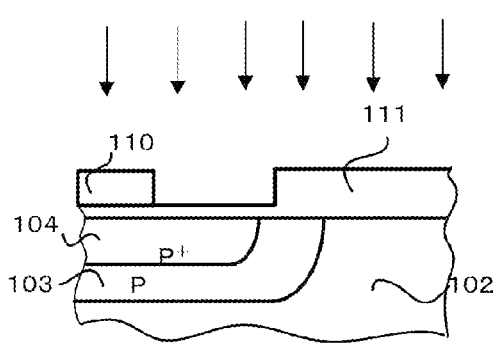
Figure 28F:
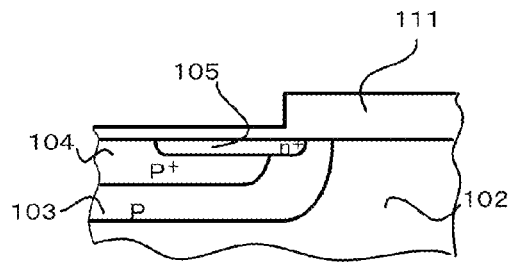
Figure 28G:
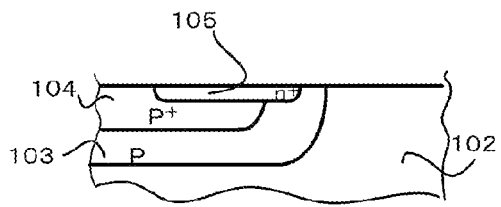
Figure 28H:
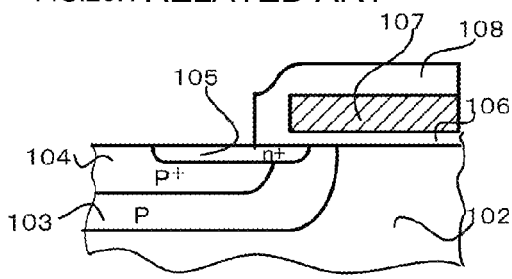
Figure 29:
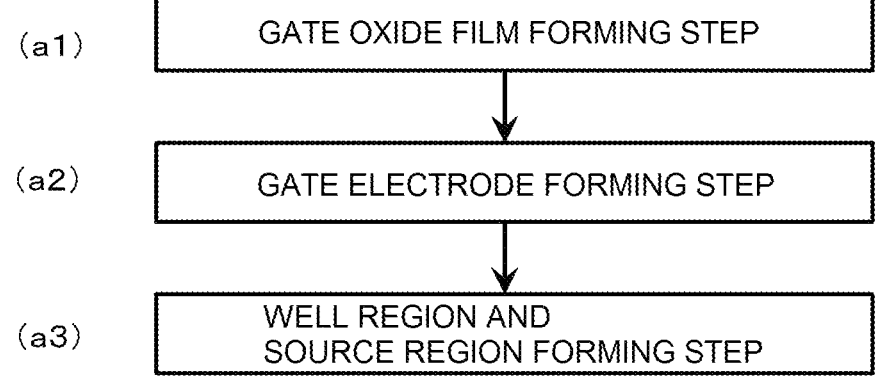
FIG. 29 is a flowchart illustrating the steps of manufacturing a surface MOS structure portion of the conventional technique.

Referring to FIGS. 2A and 2B, the surface impurity concentration of the p-type well region 3 (channel forming region) will be described. FIGS. 2A and 2B are diagrams illustrating net impurity concentration distributions in regions along lines A1-A2 and B1-B2 of MOSFETs according to the present invention and the conventional technique illustrated in FIG. 1 and FIG. 20, respectively. In FIG. 2A, a solid line indicating an impurity concentration distribution is a doping concentration distribution in a depth direction along line B1-B2 of the MOSFET illustrated in FIG. 20. Similarly, a broken line is a doping concentration distribution in a depth direction along line A1-A2 of the MOSFET illustrated in FIG. 1. Both doping concentration distributions are net doping concentration distributions taking concentration compensation of donors and acceptors in the channel forming region 3a (103a) in the p-type well region, the p-type well region 3 (103), and the $n^-$-type drift layer 2 (102) into consideration. FIG. 2B is an enlarged view of a portion surrounded by a broken-line frame in FIG. 2A. In particular, looking at the broken line for the present invention in FIG. 2B, it can be understood that the impurity concentration decreases in a portion located at a depth of 0.1 μm or smaller from the surface of the channel forming region.

Figure 18:
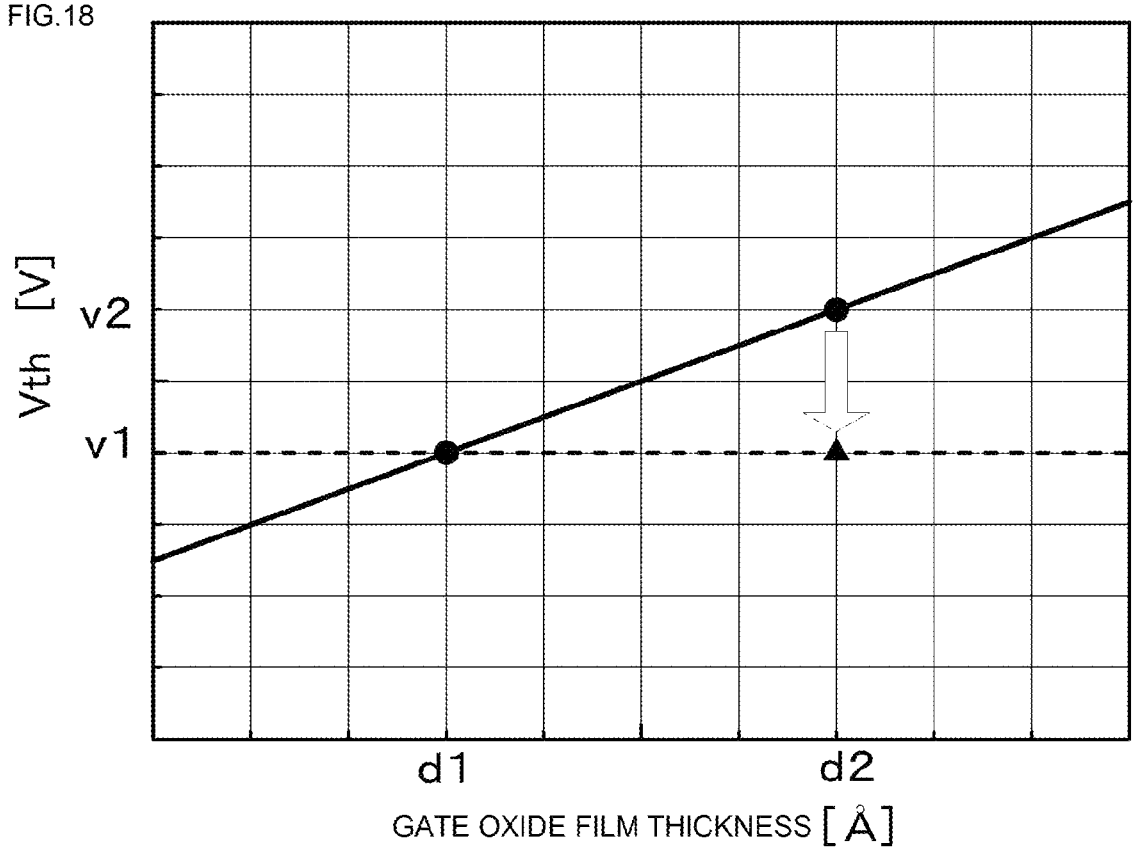
FIG. 18 is a diagram illustrating the relation between a gate oxide film and a gate threshold voltage Vth according to the present invention.

FIG. 18 is a diagram illustrating the relation between a gate oxide film and a gate threshold voltage Vth according to the present invention. As illustrated in FIG. 18, if the thickness of the gate oxide film is increased from d1 to d2, the gate threshold voltage increases from v1 to v2 in the conventional method. However, according to the present invention, even if the thickness is increased from d1 to d2, since the surface impurity concentration is reduced by the above means, the gate threshold voltage can be suppressed to v1 rather than increasing the same.

The relation between the oxidation condition and a decrease in the surface impurity concentration in the concentration adjustment and oxidation step b4 of FIG. 19 will be described. Dopant impurities are redistributed at the interface between a silicon oxide film and a silicon during oxidation.

Specifically, by thermal diffusion, dopant impurities are segregated in a silicon oxide film or a silicon due to different segregation coefficients. In the case of boron, boron near the surface of the silicon diffuses toward the outer side (outside the silicon substrate) and is segregated in the oxide film. When an oxidation temperature is low, since oxidation progresses slowly, boron taken into the oxide film diffuses in the oxide film and a boron concentration in the silicon oxide film near the interface between the silicon oxide film and the silicon decreases. As a result, boron in the silicon is more easily taken into the oxide film. In contrast, when an oxidation temperature increases, since oxidation progresses quickly, the amount of boron taken into the oxide film decreases. Based on the above, the oxidation temperature may be adjusted in the range of 800° C. to 1100° C. which are practical oxidation temperatures.

Next, the thickness of the oxide film for taking in boron will be described. An oxidation rate increases in the course where the rate is controlled by a reaction on the surface of the silicon in the initial phase of thermal oxidation. As a result, an oxide film thickness is likely to become uneven in a normal oxidation step. Thus, an oxide film thickness when the oxidation rate is controlled by diffusion of an oxide film of oxidants is may be 200 Å or larger. Moreover, the oxide film thickness may be 2000 Å or smaller. If the oxide film thickness is larger than 2000 Å, since the thickness of an oxide film on a high concentration region (for example, a source region) increases due to accelerated oxidation, large steps are formed on the surface of the silicon after an oxide film for adjustment of a threshold voltage, which is not desirable.

Since oxidation occurs in gas atmosphere, and in the case of pyro-oxidation, hydrogen included in an oxide film accelerates diffusion of boron, a boron concentration near the interface between the oxide film and the silicon decreases. Due to this, the amount of boron taken into the oxide film becomes larger as compared to dry-oxidation. Although any one of pyro-oxidation and dry-oxidation can be used, since pyro-oxidation provides a higher oxidation rate than dry-oxidation, the time required for oxidizing a film having the same thickness decreases. These oxidation methods can be appropriately selected by taking the number of process steps and the amount of boron taken into consideration.

As described above, the surface impurity concentration of the channel forming region $3a$ of the p-type well region 3 of the MOSFET manufactured according to the method of Example 1 decreases as compared to the surface impurity concentration of the conventional technique. Moreover, inversion of a conductivity type of the p-type well region 3 occurs near the junction terminal at which a pn junction of the p-type well region 3 crosses the surface, and such a phenomenon occurs that the junction rolls inward at the terminal as illustrated in FIG. 10. If the roll-in shape at the junction terminal is too large, a channel length decreases and a short-channel effect is likely to occur. Thus, the concentration and the diffusion depth of the p-type well region 3 are adjusted so that the short-channel effect does not occur.

As described above, the surface MOS structure of Example 1 of the present invention can decrease the surface impurity concentration of the channel forming region $3a$ of the p-type well region 3. As a result, it is possible to increase the thickness of the gate oxide film while maintaining the gate threshold voltage Vth at a fixed value. In this way, the gate withstanding power of the MOSFET of the present invention is improved. In other words, if the thickness of the gate oxide film is constant, it is possible to decrease the gate threshold voltage Vth.

Example 2

In the method of Example 1, when a MOSFET having a very small cell pattern having such a small channel length as described above is manufactured, there is a problem in that the junction terminal of the p-type well region 3 has such a roll-in shape as shown in FIG. 10 and a short-channel effect is likely to occur. In Example 2, when a MOSFET having a very small cell pattern is manufactured, etching is performed so that a tapered portion is formed in an edge close to the opening, of the oxide film mask used for the self-alignment, which is different from the MOSFET of Example 1.

Hereinafter, a method of manufacturing a MOSFET according to Example 2 will be described. The flow of major steps is the same as that of FIG. 19 described in Example 1.

First, a thick field oxide film 11 is grown on a surface of a silicon semiconductor substrate which is a stacked layer including an $n^+$-type low-resistance semiconductor substrate 1 and an $n^-$-type drift layer 2. Photolithography and etching is performed to form a field oxide film mask 11 which is etched into a predetermined p-type well forming opening pattern. In this case, etching is performed such that the edge of the field oxide film mask 11 does not extend along a direction vertical to the surface of the semiconductor substrate but has a tapered shape having an angle θ (°) from the vertical direction. An etching method that forms such a tapered shape is not particularly limited, and an optional existing method may be used. For example, ions may be implanted into the surface of the oxide film to form damage on the surface of the oxide film and an etching rate may be increased. In particular, ions implanted may be such ions that do not become n-type or p-type dopants to the surface of the silicon semiconductor substrate, and for example, He, Ar, or the like may be used.

Figure 11:
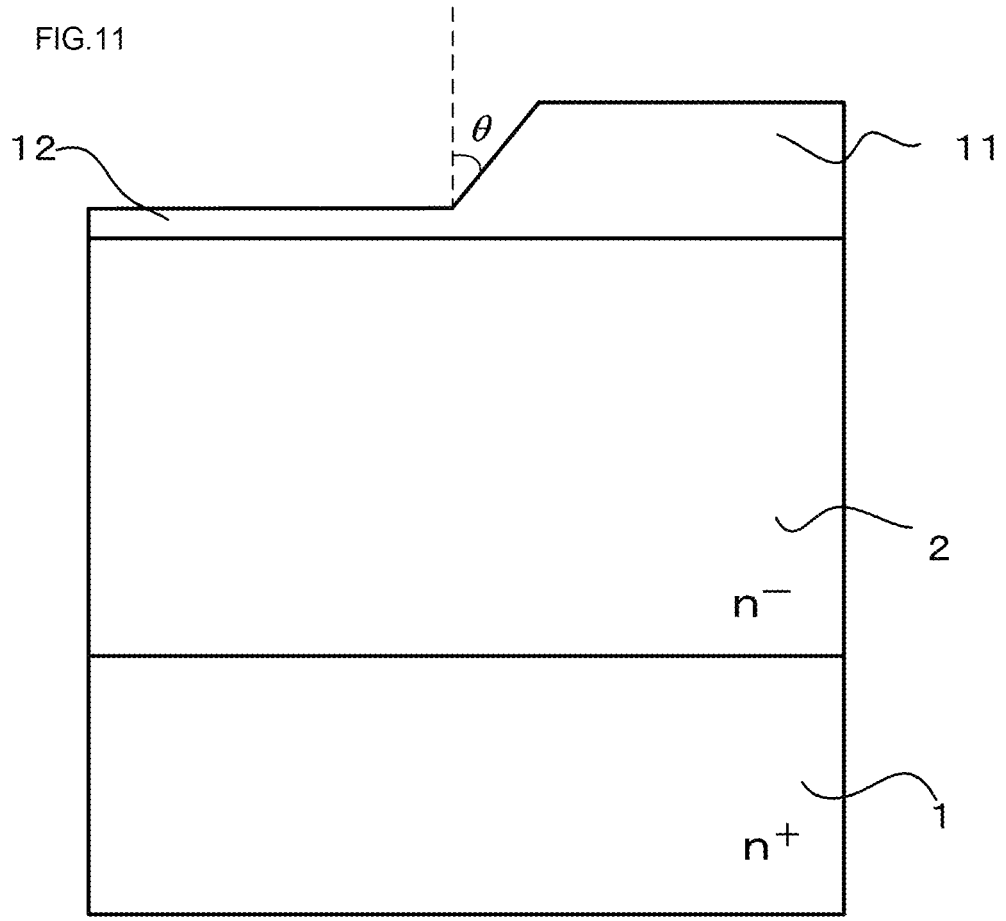
FIG. 11 is a first cross-sectional view of a main portion of a semiconductor substrate, illustrating the steps of manufacturing a surface MOS structure of a MOSFET according to Example 2 of the present invention.
Figure 12:
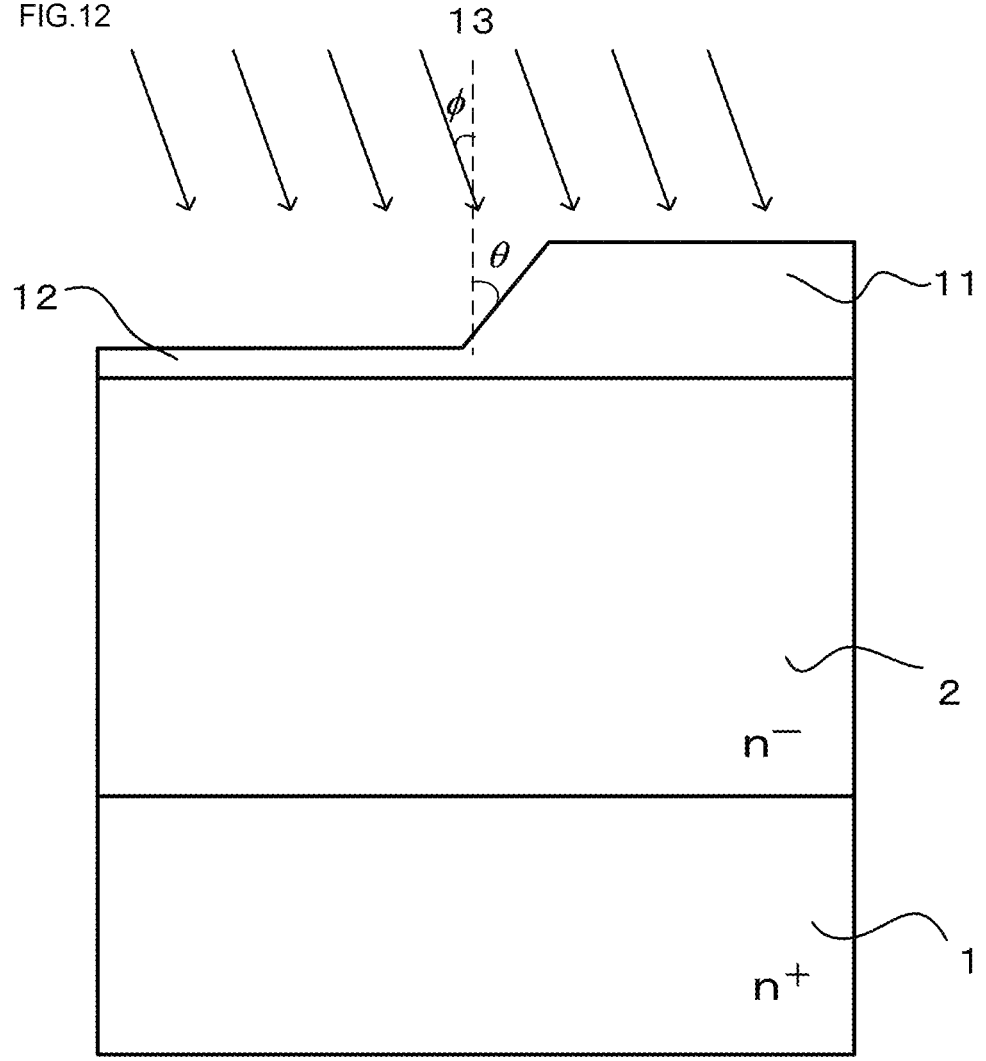
FIG. 12 is a second cross-sectional view of a main portion of a semiconductor substrate, illustrating the steps of manufacturing a surface MOS structure of a MOSFET according to Example 2 of the present invention.

Subsequently, a thin screen oxide film 12 is formed in the openings (see FIG. 11). Subsequently, boron ions ($B^+$) 13 are implanted. In this case, ions are implanted in an oblique direction rather than a direction vertical to the surface of the semiconductor substrate (see FIG. 12). In this case, the ion implantation angle φ may be larger than an angle) (φ=0° vertical to the surface of the semiconductor substrate and equal to or smaller than an angle (φ=90°−θ) vertical to the edge surface of the field oxide film mask 11 having a tapered shape. Moreover, during the ion implantation, the semiconductor substrate may be rotated with a tilt angle φ.

When ions are implanted in a direction approximately vertical to the edge surface (tapered surface) of the field oxide film mask 11 having a tapered shape, the ion implantation region increases in the direction of increasing the thickness of the field oxide film mask 11 by the amount of a region located below the tapered surface of the field oxide film mask 11 more than Example 1.

Figure 13:
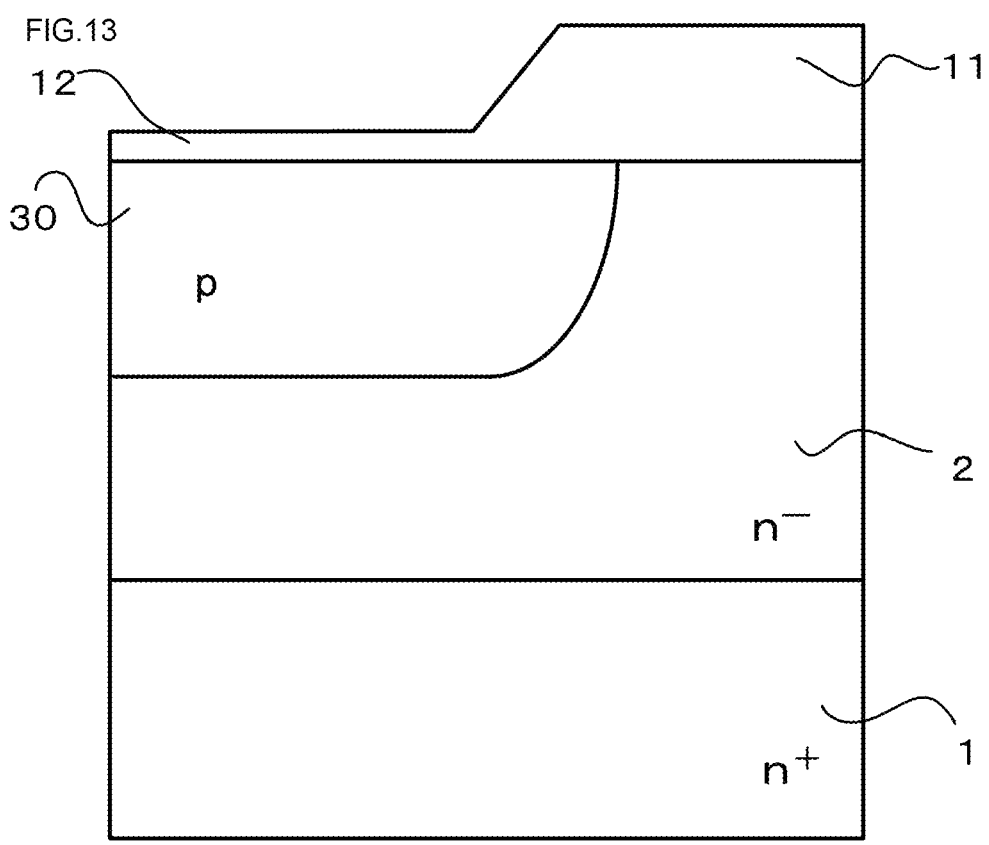
FIG. 13 is a third cross-sectional view of a main portion of a semiconductor substrate, illustrating the steps of manufacturing a surface MOS structure of a MOSFET according to Example 2 of the present invention.

Subsequently, a p-type well region 30 having a predetermined depth is formed by thermal diffusion (see FIG. 13). By this thermal diffusion, the length of a region of the surface of the p-type well region 3, extending in the horizontal direction in which the impurity concentration decreases, increases by the length of a region below the tapered surface more than a horizontally diffused portion when the tapered portion is not present.

Figure 14:
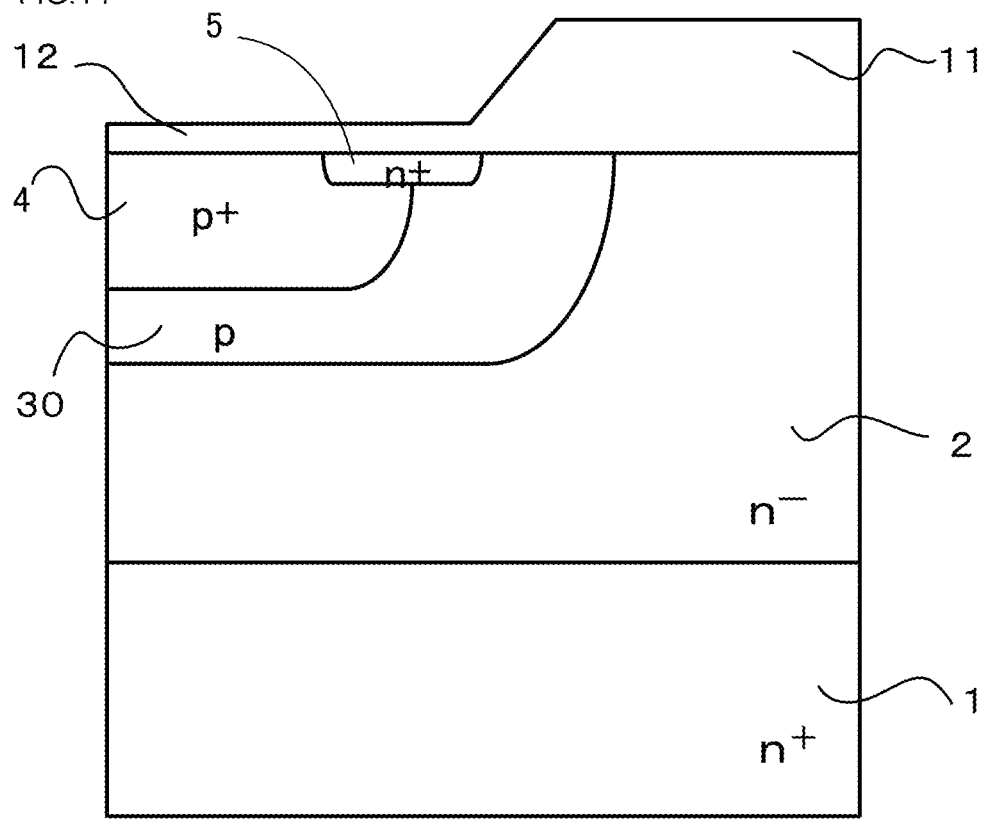
FIG. 14 is a fourth cross-sectional view of a main portion of a semiconductor substrate, illustrating the steps of manufacturing a surface MOS structure of a MOSFET according to Example 2 of the present invention.

After that, a $p^+$-type contact region 4 and an $n^+$-type source region 5 are formed using resist masks 14 and 15 and the field oxide film mask 11 similarly to Example 1 (see FIG. 14).

Subsequently, similarly to step b3 of Example 1, both the screen oxide film 12 and the field oxide film mask 11 are removed by etching.

Figure 15:
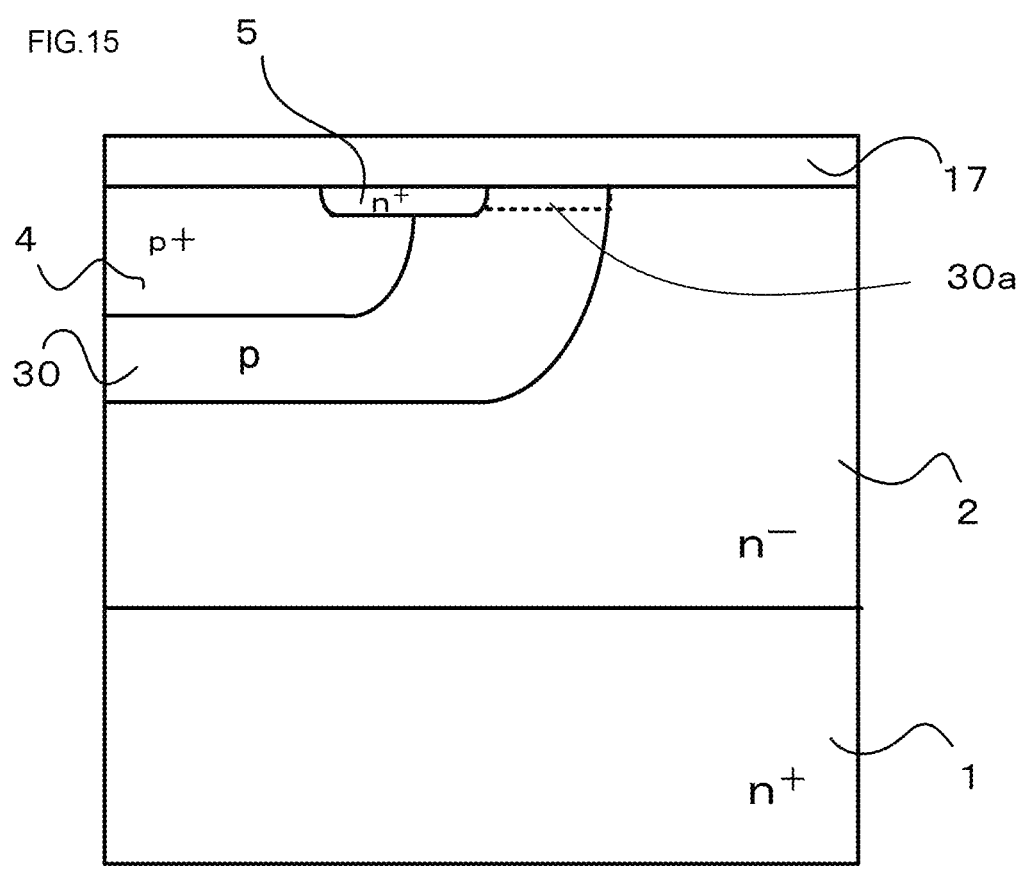
FIG. 15 is a fifth cross-sectional view of a main portion of a semiconductor substrate, illustrating the steps of manufacturing a surface MOS structure of a MOSFET according to Example 2 of the present invention.

Subsequently, similarly to step b4 of Example 1, an oxide film 17 is grown again on the etched surface of the semiconductor substrate. In this way, boron on the surface of the p-type well region 30 is segregated toward the oxide film 17. Similarly to Example 1, the amount of segregated boron can be controlled by adjusting an oxidation condition. Further, in Example 2, due to oblique ion implantation of the tapered portion, a boron implantation region of the p-type well region extends in the horizontal direction. Due to this, the surface impurity concentration of the channel forming region 30a increases more than in the case of Example 1. As a result, even when boron on the surface is pulled toward the oxide film 17, the roll-in phenomenon at the junction terminal will rarely occur (see FIG. 15). On the other hand, since the maximum surface concentration that determines the gate threshold voltage decreases as in Example 1, in comparison to when the tapered portion is not present, it is possible to decrease the gate threshold voltage Vth.

Figure 16:
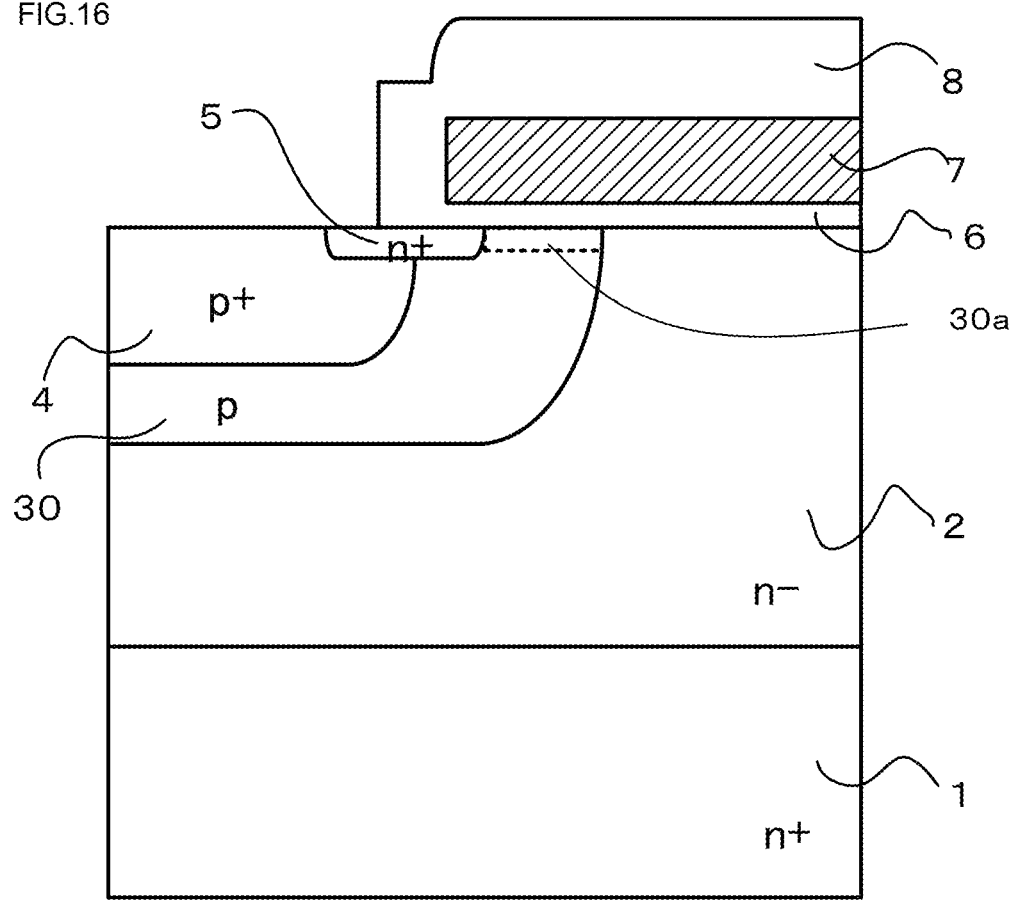
FIG. 16 is a sixth cross-sectional view of a main portion of a semiconductor substrate, illustrating the steps of manufacturing a surface MOS structure of a MOSFET according to Example 2 of the present invention.
Figure 17:
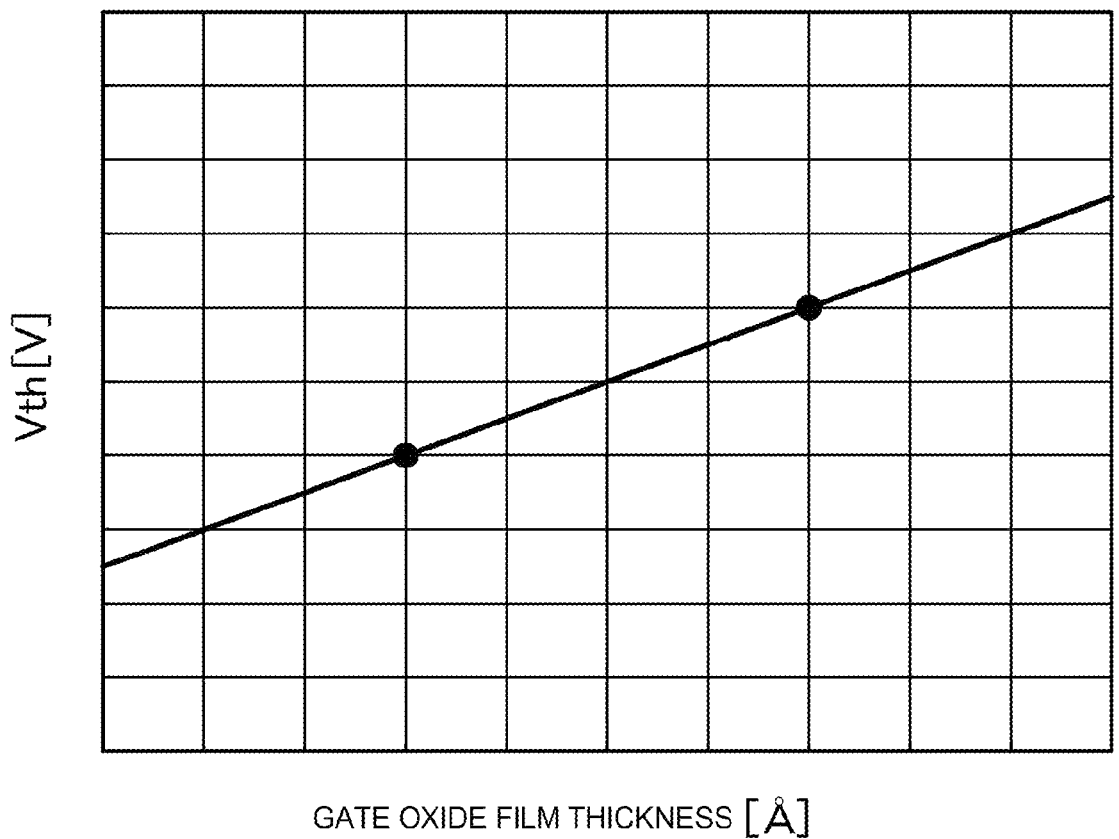
FIG. 17 is a diagram illustrating the relation between a gate oxide film and a gate threshold voltage Vth of a MOS-type semiconductor device having a general surface MOS structure.

Subsequently, similarly to Example 1, a process of forming a gate oxide film 6, a gate electrode 7, and an interlayer insulating film 8 is performed, which is a wafer process of the MOSFET according to Example 2 (see FIG. 16).

According to the MOSFET manufacturing method of Example 2 which uses such a wafer process, the surface impurity concentration of the channel forming region 30a of the p-type well region 30 decreases. Further, due to the boron ion implantation from the tapered portion, it is possible to suppress a roll-in phenomenon near the pn junction terminal of the p-type well region 30. As a result, a short-channel effect can be avoided.

It will be apparent to one skilled in the art that the manner of making and using the claimed invention has been adequately disclosed in the above-written description of the exemplary embodiments taken together with the drawings. Furthermore, the foregoing description of the embodiments according to the invention is provided for illustration only, and not for limiting the invention as defined by the appended claims and their equivalents.

It will be understood that the above description of the exemplary embodiments of the invention are susceptible to various modifications, changes and adaptations, and the same are intended to be comprehended within the meaning and range of equivalents of the appended claims.

EXPLANATION OF REFERENCE NUMERALS

1: n$^+$-TYPE LOW-RESISTANCE SEMICONDUCTOR SUBSTRATE
2, 102: n$^-$-TYPE DRIFT LAYER
3, 30, 103: p-TYPE WELL REGION
3a, 30a, 103a: CHANNEL FORMING REGION
4: p$^+$-TYPE CONTACT REGION
5: n$^+$-TYPE SOURCE REGION
6: GATE OXIDE FILM
7: GATE ELECTRODE
8: INTERLAYER INSULATING FILM
11: FIELD OXIDE FILM
12: SCREEN OXIDE FILM
13: BORON ION IMPLANTATION
14, 15: RESIST MASK
16: ARSENIC ION IMPLANTATION
17: OXIDE FILM

What is claimed is:

1. A method of manufacturing a MOS-type semiconductor device, comprising:
an oxide film forming step of forming a first thermal oxide film on one principal surface of a drift layer of a first conductivity type and patterning the first thermal oxide film;
a well region forming step of selectively implanting impurity ions of a second conductivity type by using the first thermal oxide film as a mask and performing a heat treatment to form a well region of the second conductivity type having a higher impurity concentration than the drift layer;
a source region forming step of providing a resist film above a surface of the well region so as to be separated from the first thermal oxide film, implanting impurity ions of the first conductivity type by using the resist film and the first thermal oxide film as a mask, removing the resist film, and performing a heat treatment to form a source region of the first conductivity type having a higher impurity concentration than the well region;
a second oxide film forming and removing step of removing the first thermal oxide film, and after removing the first thermal oxide film, forming a second thermal oxide film, and then removing the second thermal oxide film from at least a region over which a gate electrode will be formed; and
a MOS gate forming step of forming a gate oxide film so as to cover surfaces of the source region, the well region, and the drift layer which are adjacent to each other and forming the gate electrode on a surface of the gate oxide film.

2. The method of manufacturing a MOS-type semiconductor device according to claim 1, further comprising:
before the source region forming step, a contact region forming step of providing a contact region resist film above the surface of the well region, implanting impurity ions of the second conductivity type by using the resist film and the first thermal oxide film as a mask, removing the contact region resist film, and performing a heat treatment to form a contact region of the second conductivity type having a higher impurity concentration than the well region.

3. The method of manufacturing a MOS-type semiconductor device according to claim 2, wherein
the semiconductor device is a MOSFET.

4. The method of manufacturing a MOS-type semiconductor device according to claim 1, wherein
in the oxide film forming step, when the first thermal oxide film is etched, a tapered surface is formed on an edge of the first thermal oxide film.

5. The method of manufacturing a MOS-type semiconductor device according to claim 4, wherein
in the oxide film forming step, after the tapered surface is formed on the thermal oxide film, ion implantation is performed at an oblique angle equal to or smaller than an angle vertical to the tapered surface.

6. The method of manufacturing a MOS-type semiconductor device according to claim 5, wherein
the semiconductor device is a MOSFET.

7. The method of manufacturing a MOS-type semiconductor device according to claim 4, wherein
the semiconductor device is a MOSFET.

8. The method of manufacturing a MOS-type semiconductor device according to claim 1, wherein
the semiconductor device is a MOSFET.

9. The method of manufacturing a MOS-type semiconductor device according to claim 1, wherein
in the second oxide film forming and removing step,
a portion of impurities of the second conductivity type on a surface of the well region is segregated into the second thermal oxide film, and a concentration of impurities of the second conductivity type on the surface of the well region decreases as compared to that before the second oxide film forming and removing step.

10. A method, comprising:
forming a first thermal oxide film on a drift layer formed on a semiconductor substrate;
forming a well region in a surface of the drift layer;
forming a contact region in a surface of the well region;
forming a source region in a surface of the contact region and the well region; and
decreasing a concentration of impurities on the surface of the well region, at least partly by removing the first thermal oxide film, and after removing the first thermal oxide film, forming a second thermal oxide on the contact region, the source region and the well region, and removing the second thermal oxide film from at least a region over which a gate electrode will be formed.

11. The method of claim 10, further comprising forming an angled side wall in the first thermal oxide film.

12. The method of claim 11, further comprising implanting ions at an oblique angle relative to a surface of the angled side wall.

* * * * *